(12) United States Patent
Shokrollahi et al.

(10) Patent No.: US 10,153,591 B2
(45) Date of Patent: Dec. 11, 2018

(54) SKEW-RESISTANT MULTI-WIRE CHANNEL

(71) Applicant: Kandou Labs, S.A., Lausanne (CH)

(72) Inventors: Amin Shokrollahi, Preverenges (CH); Margaret Wang Johnston, Englewood, NJ (US)

(73) Assignee: KANDOU LABS, S.A., Lausanne (CH)

( * ) Notice: Subject to any disclaimer, the term of this patent is extended or adjusted under 35 U.S.C. 154(b) by 0 days.

(21) Appl. No.: 15/499,869

(22) Filed: Apr. 27, 2017

(65) Prior Publication Data

US 2017/0317449 A1  Nov. 2, 2017

Related U.S. Application Data

(60) Provisional application No. 62/328,735, filed on Apr. 28, 2016.

(51) Int. Cl.
*H01R 13/6461* (2011.01)
*H01R 12/71* (2011.01)
(Continued)

(52) U.S. Cl.
CPC ....... *H01R 13/6461* (2013.01); *H01R 12/716* (2013.01); *H01R 12/73* (2013.01);
(Continued)

(58) Field of Classification Search
CPC ..... H01P 3/00; H01P 1/04; H01P 5/02; H05K 1/0248; H05K 1/025; H05K 1/0253;
(Continued)

(56) References Cited

U.S. PATENT DOCUMENTS

| 668,687 A | 2/1901 | Mayer |
|---|---|---|
| 780,883 A | 1/1905 | Hinchman |

(Continued)

FOREIGN PATENT DOCUMENTS

| CN | 1864346 | 11/2006 |
|---|---|---|
| CN | 101478286 | 7/2009 |

(Continued)

OTHER PUBLICATIONS

Giovaneli, et al., "Space-frequency coded OFDM system for multi-wire power line communications", Power Line Communications and Its Applications, 20015 International Symposium on Vancouver, BC, Canada, Apr. 6-8, 2005, Piscataway, NJ, pp. 191-195.

(Continued)

*Primary Examiner* — Janice N Tieu
(74) *Attorney, Agent, or Firm* — Invention Mine, LLC

(57) ABSTRACT

Methods and systems described include a first dielectric material having a plurality of embedded conductors of a multi-wire channel, the plurality of embedded conductors comprising at least a first, second and third conductor, wherein a first distance between the first and second conductors is less than a second distance between the first and third conductors, wherein the first dielectric material has a first dielectric constant $\varepsilon_1$ and a second dielectric material embedded in the first dielectric material, the second dielectric material embedded in between the first and third conductors, the second dielectric material having a second dielectric constant $\varepsilon_2$, wherein $\varepsilon_2 > \varepsilon_1$.

20 Claims, 15 Drawing Sheets

(51) Int. Cl.
   *H01R 13/405* (2006.01)
   *H01R 13/504* (2006.01)
   *H04L 25/49* (2006.01)
   *H01R 12/73* (2011.01)
   *H01P 1/04* (2006.01)
   *H05K 1/02* (2006.01)
   *H01P 3/00* (2006.01)
   *H01P 5/02* (2006.01)

(52) U.S. Cl.
   CPC ......... *H01R 13/405* (2013.01); *H01R 13/504* (2013.01); *H04L 25/4917* (2013.01); *H01P 1/04* (2013.01); *H01P 3/00* (2013.01); *H01P 5/02* (2013.01); *H05K 1/025* (2013.01); *H05K 1/0248* (2013.01); *H05K 1/0253* (2013.01)

(58) Field of Classification Search
   CPC .............. H01R 13/6461; H01R 12/716; H01R 13/405; H01R 13/504; H04L 25/4917
   See application file for complete search history.

(56) References Cited

U.S. PATENT DOCUMENTS

| | | |
|---|---|---|
| 3,196,351 A | 7/1965 | Slepian |
| 3,636,463 A | 1/1972 | Ongkiehong |
| 3,939,468 A | 2/1976 | Mastin |
| 4,163,258 A | 7/1979 | Ebihara |
| 4,181,967 A | 1/1980 | Nash |
| 4,206,316 A | 6/1980 | Burnsweig |
| 4,276,543 A | 6/1981 | Miller |
| 4,486,739 A | 12/1984 | Franaszek |
| 4,499,550 A | 2/1985 | Ray, III |
| 4,722,084 A | 1/1988 | Morton |
| 4,772,845 A | 9/1988 | Scott |
| 4,774,498 A | 9/1988 | Traa |
| 4,864,303 A | 9/1989 | Ofek |
| 4,897,657 A | 1/1990 | Brubaker |
| 4,974,211 A | 11/1990 | Corl |
| 5,017,924 A | 5/1991 | Guiberteau |
| 5,053,974 A | 10/1991 | Penz |
| 5,166,956 A | 11/1992 | Baltus |
| 5,168,509 A | 12/1992 | Nakamura |
| 5,266,907 A | 11/1993 | Dacus |
| 5,283,761 A | 2/1994 | Gillingham |
| 5,287,305 A | 2/1994 | Yoshida |
| 5,311,516 A | 5/1994 | Kuznicki |
| 5,331,320 A | 7/1994 | Cideciyan |
| 5,412,689 A | 5/1995 | Chan |
| 5,449,895 A | 9/1995 | Hecht |
| 5,459,465 A | 10/1995 | Kagey |
| 5,461,379 A | 10/1995 | Weinman |
| 5,510,736 A | 4/1996 | Van De Plassche |
| 5,511,119 A | 4/1996 | Lechleider |
| 5,539,360 A * | 7/1996 | Vannatta .................. H01P 3/00 174/117 FF |
| 5,553,097 A | 9/1996 | Dagher |
| 5,566,193 A | 10/1996 | Cloonan |
| 5,599,550 A | 2/1997 | Kohlruss |
| 5,626,651 A | 5/1997 | Dullien |
| 5,629,651 A | 5/1997 | Mizuno |
| 5,659,353 A | 8/1997 | Kostreski |
| 5,727,006 A | 3/1998 | Dreyer |
| 5,748,948 A | 5/1998 | Yu |
| 5,802,356 A | 9/1998 | Gaskins |
| 5,825,808 A | 10/1998 | Hershey |
| 5,856,935 A | 1/1999 | Moy |
| 5,875,202 A | 2/1999 | Venters |
| 5,945,935 A | 8/1999 | Kusumoto |
| 5,949,060 A | 9/1999 | Schattschneider |
| 5,982,954 A | 11/1999 | Delen |
| 5,995,016 A | 11/1999 | Perino |
| 5,999,016 A | 12/1999 | McClintock |
| 6,005,895 A | 12/1999 | Perino |
| 6,084,883 A | 7/2000 | Norrell |
| 6,119,263 A | 9/2000 | Mowbray |
| 6,172,634 B1 | 1/2001 | Leonowich |
| 6,175,230 B1 | 1/2001 | Hamblin |
| 6,232,908 B1 | 5/2001 | Nakaigawa |
| 6,278,740 B1 | 8/2001 | Nordyke |
| 6,316,987 B1 | 11/2001 | Dally |
| 6,346,907 B1 | 2/2002 | Dacy |
| 6,359,931 B1 | 3/2002 | Perino |
| 6,378,073 B1 | 4/2002 | Davis |
| 6,384,758 B1 | 5/2002 | Michalski |
| 6,398,359 B1 | 6/2002 | Silverbrook |
| 6,404,820 B1 | 6/2002 | Postol |
| 6,417,737 B1 | 7/2002 | Moloudi |
| 6,433,800 B1 | 8/2002 | Holtz |
| 6,452,420 B1 | 9/2002 | Wong |
| 6,473,877 B1 | 10/2002 | Sharma |
| 6,483,828 B1 | 11/2002 | Balachandran |
| 6,504,875 B2 | 1/2003 | Perino |
| 6,509,773 B2 | 1/2003 | Buchwald |
| 6,522,699 B1 | 2/2003 | Anderson |
| 6,556,628 B1 | 4/2003 | Poulton |
| 6,563,382 B1 | 5/2003 | Yang |
| 6,621,427 B2 | 9/2003 | Greenstreet |
| 6,624,699 B2 | 9/2003 | Yin |
| 6,650,638 B1 | 11/2003 | Walker |
| 6,661,355 B2 | 12/2003 | Cornelius |
| 6,664,355 B2 | 12/2003 | Kim |
| 6,686,879 B2 | 2/2004 | Shattil |
| 6,690,739 B1 | 2/2004 | Mui |
| 6,766,342 B2 | 7/2004 | Kechriotis |
| 6,772,351 B1 | 8/2004 | Werner |
| 6,839,429 B1 | 1/2005 | Gaikwad |
| 6,839,587 B2 | 1/2005 | Yonce |
| 6,854,030 B2 | 2/2005 | Perino |
| 6,865,234 B1 | 3/2005 | Agazzi |
| 6,865,236 B1 | 3/2005 | Terry |
| 6,876,317 B2 | 4/2005 | Sankaran |
| 6,898,724 B2 | 5/2005 | Chang |
| 6,927,709 B2 | 8/2005 | Kiehl |
| 6,954,492 B1 | 10/2005 | Williams |
| 6,963,622 B2 | 11/2005 | Eroz |
| 6,972,701 B2 | 12/2005 | Jansson |
| 6,973,613 B2 | 12/2005 | Cypher |
| 6,976,194 B2 | 12/2005 | Cypher |
| 6,982,954 B2 | 1/2006 | Dhong |
| 6,990,138 B2 | 1/2006 | Bejjani |
| 6,991,038 B2 | 1/2006 | Guesnon |
| 6,993,311 B2 | 1/2006 | Li |
| 6,999,516 B1 | 2/2006 | Rajan |
| 7,023,817 B2 | 4/2006 | Kuffner |
| 7,039,136 B2 | 5/2006 | Olson |
| 7,053,802 B2 | 5/2006 | Cornelius |
| 7,075,996 B2 | 7/2006 | Simon |
| 7,080,288 B2 | 7/2006 | Ferraiolo |
| 7,082,557 B2 | 7/2006 | Schauer |
| 7,085,153 B2 | 8/2006 | Ferrant |
| 7,085,336 B2 | 8/2006 | Lee |
| 7,127,003 B2 | 10/2006 | Rajan |
| 7,130,944 B2 | 10/2006 | Perino |
| 7,142,612 B2 | 11/2006 | Horowitz |
| 7,142,865 B2 | 11/2006 | Tsai |
| 7,164,631 B2 | 1/2007 | Tateishi |
| 7,167,019 B2 | 1/2007 | Broyde |
| 7,176,823 B2 | 2/2007 | Zabroda |
| 7,180,949 B2 | 2/2007 | Kleveland |
| 7,184,483 B2 | 2/2007 | Rajan |
| 7,199,728 B2 | 4/2007 | Dally |
| 7,231,558 B2 | 6/2007 | Gentieu |
| 7,269,130 B2 | 9/2007 | Pitio |
| 7,269,212 B1 | 9/2007 | Chau |
| 7,335,976 B2 | 2/2008 | Chen |
| 7,336,112 B1 | 2/2008 | Sha |
| 7,339,990 B2 | 3/2008 | Hidaka |
| 7,346,819 B2 | 3/2008 | Bansal |
| 7,348,989 B2 | 3/2008 | Stevens |
| 7,349,484 B2 | 3/2008 | Stojanovic |
| 7,356,213 B1 | 4/2008 | Cunningham |
| 7,358,869 B1 | 4/2008 | Chiarulli |

(56) References Cited

U.S. PATENT DOCUMENTS

| | | | |
|---|---|---|---|
| 7,362,130 | B2 | 4/2008 | Broyde |
| 7,362,697 | B2 | 4/2008 | Becker |
| 7,366,942 | B2 | 4/2008 | Lee |
| 7,370,264 | B2 | 5/2008 | Worley |
| 7,372,390 | B2 | 5/2008 | Yamada |
| 7,389,333 | B2 | 6/2008 | Moore |
| 7,397,302 | B2 | 7/2008 | Bardsley |
| 7,400,276 | B1 | 7/2008 | Sotiriadis |
| 7,428,273 | B2 | 9/2008 | Foster |
| 7,456,778 | B2 | 11/2008 | Werner |
| 7,462,956 | B2 | 12/2008 | Lan |
| 7,496,162 | B2 | 2/2009 | Srebranig |
| 7,570,704 | B2 | 4/2009 | Nagarajan |
| 7,535,957 | B2 | 5/2009 | Ozawa |
| 7,539,532 | B2 | 5/2009 | Tran |
| 7,599,390 | B2 | 10/2009 | Pamarti |
| 7,613,234 | B2 | 11/2009 | Raghavan |
| 7,616,075 | B2 | 11/2009 | Kushiyama |
| 7,620,116 | B2 | 11/2009 | Bessios |
| 7,633,850 | B2 | 12/2009 | Nagarajan |
| 7,639,596 | B2 | 12/2009 | Cioffi |
| 7,643,588 | B2 | 1/2010 | Visalli |
| 7,650,525 | B1 | 1/2010 | Chang |
| 7,656,321 | B2 | 2/2010 | Wang |
| 7,694,204 | B2 | 4/2010 | Schmidt |
| 7,697,915 | B2 | 4/2010 | Behzad |
| 7,698,088 | B2 | 4/2010 | Sul |
| 7,706,456 | B2 | 4/2010 | Laroia |
| 7,706,524 | B2 | 4/2010 | Zerbe |
| 7,746,764 | B2 | 6/2010 | Rawlins |
| 7,768,312 | B2 | 8/2010 | Hirose |
| 7,787,572 | B2 | 8/2010 | Scharf |
| 7,804,361 | B2 | 9/2010 | Lim |
| 7,808,456 | B2 | 10/2010 | Chen |
| 7,808,883 | B2 | 10/2010 | Green |
| 7,841,909 | B2 | 11/2010 | Murray |
| 7,869,497 | B2 | 1/2011 | Benvenuto |
| 7,869,546 | B2 | 1/2011 | Tsai |
| 7,882,413 | B2 | 2/2011 | Chen |
| 7,899,653 | B2 | 3/2011 | Hollis |
| 7,907,676 | B2 | 3/2011 | Stojanovic |
| 7,933,770 | B2 | 4/2011 | Kruger |
| 8,000,664 | B2 | 8/2011 | Khorram |
| 8,030,999 | B2 | 10/2011 | Chatterjee |
| 8,036,300 | B2 | 10/2011 | Evans |
| 8,040,200 | B2 * | 10/2011 | Minegishi ............... H01P 3/026 333/238 |
| 8,050,332 | B2 | 11/2011 | Chung |
| 8,055,095 | B2 | 11/2011 | Palotai |
| 8,064,535 | B2 | 11/2011 | Wiley |
| 8,085,172 | B2 | 12/2011 | Li |
| 8,091,006 | B2 | 1/2012 | Prasad |
| 8,106,806 | B2 | 1/2012 | Toyomura |
| 8,149,906 | B2 | 4/2012 | Saito |
| 8,159,375 | B2 | 4/2012 | Abbasfar |
| 8,159,376 | B2 | 4/2012 | Abbasfar |
| 8,180,931 | B2 | 5/2012 | Lee |
| 8,185,807 | B2 | 5/2012 | Oh |
| 8,199,849 | B2 | 6/2012 | Oh |
| 8,199,863 | B2 | 6/2012 | Chen |
| 8,218,670 | B2 | 7/2012 | AbouRjeily |
| 8,233,544 | B2 | 7/2012 | Bao |
| 8,245,094 | B2 | 8/2012 | Jiang |
| 8,253,454 | B2 | 8/2012 | Lin |
| 8,279,094 | B2 | 10/2012 | Abbasfar |
| 8,279,745 | B2 | 10/2012 | Dent |
| 8,289,914 | B2 | 10/2012 | Li |
| 8,295,250 | B2 | 10/2012 | Gorokhov |
| 8,295,336 | B2 | 10/2012 | Lutz |
| 8,305,247 | B2 | 11/2012 | Pun |
| 8,310,389 | B1 | 11/2012 | Chui |
| 8,341,492 | B2 | 12/2012 | Shen |
| 8,359,445 | B2 | 1/2013 | Ware |
| 8,365,035 | B2 | 1/2013 | Nara |
| 8,406,315 | B2 | 3/2013 | Tsai |
| 8,406,316 | B2 | 3/2013 | Sugita |
| 8,429,492 | B2 | 4/2013 | Yoon |
| 8,429,495 | B2 | 4/2013 | Przybylski |
| 8,437,440 | B1 | 5/2013 | Zhang |
| 8,442,099 | B1 | 5/2013 | Sederat |
| 8,442,210 | B2 | 5/2013 | Zerbe |
| 8,443,223 | B2 | 5/2013 | Abbasfar |
| 8,451,913 | B2 | 5/2013 | Oh |
| 8,462,891 | B2 | 6/2013 | Kizer |
| 8,472,513 | B2 | 6/2013 | Malipatil |
| 8,620,166 | B2 | 6/2013 | Dong |
| 8,498,344 | B2 | 7/2013 | Wilson |
| 8,498,368 | B1 | 7/2013 | Husted |
| 8,520,348 | B2 | 8/2013 | Dong |
| 8,520,493 | B2 | 8/2013 | Goulahsen |
| 8,539,318 | B2 | 9/2013 | Cronie |
| 8,547,272 | B2 | 10/2013 | Nestler |
| 8,577,284 | B2 | 11/2013 | Seo |
| 8,578,246 | B2 | 11/2013 | Mittelholzer |
| 8,588,254 | B2 | 11/2013 | Diab |
| 8,588,280 | B2 | 11/2013 | Oh |
| 8,593,305 | B1 | 11/2013 | Tajalli |
| 8,602,643 | B2 | 12/2013 | Gardiner |
| 8,604,879 | B2 | 12/2013 | Mourant |
| 8,638,241 | B2 | 1/2014 | Sudhakaran |
| 8,643,437 | B2 | 2/2014 | Chiu |
| 8,649,445 | B2 | 2/2014 | Cronie |
| 8,649,460 | B2 | 2/2014 | Ware |
| 8,649,556 | B2 | 2/2014 | Wedge |
| 8,649,840 | B2 | 2/2014 | Sheppard, Jr. |
| 8,674,861 | B2 | 3/2014 | Matsuno |
| 8,687,968 | B2 | 4/2014 | Nosaka |
| 8,711,919 | B2 | 4/2014 | Kumar |
| 8,718,184 | B1 | 5/2014 | Cronie |
| 8,755,426 | B1 | 6/2014 | Cronie |
| 8,773,964 | B2 | 7/2014 | Hsueh |
| 8,780,687 | B2 | 7/2014 | Clausen |
| 8,782,578 | B2 | 7/2014 | Tell |
| 8,791,735 | B1 | 7/2014 | Shibasaki |
| 8,831,440 | B2 | 9/2014 | Yu |
| 8,841,936 | B2 | 9/2014 | Nakamura |
| 8,879,660 | B1 | 11/2014 | Peng |
| 8,897,134 | B2 | 11/2014 | Kern |
| 8,898,504 | B2 | 11/2014 | Baumgartner |
| 8,938,171 | B2 | 1/2015 | Tang |
| 8,949,693 | B2 | 2/2015 | Ordentlich |
| 8,951,072 | B2 | 2/2015 | Hashim |
| 8,975,948 | B2 | 3/2015 | GonzalezDiaz |
| 8,989,317 | B1 | 3/2015 | Holden |
| 9,015,566 | B2 | 4/2015 | Cronie |
| 9,020,049 | B2 | 4/2015 | Schwager |
| 9,036,764 | B1 | 5/2015 | Hossain |
| 9,059,816 | B1 | 6/2015 | Simpson |
| 9,069,995 | B1 | 6/2015 | Cronie |
| 9,077,386 | B1 | 7/2015 | Holden |
| 9,083,576 | B1 | 7/2015 | Hormati |
| 9,093,791 | B2 | 7/2015 | Liang |
| 9,100,232 | B1 | 8/2015 | Hormati |
| 9,106,465 | B2 | 8/2015 | Walter |
| 9,124,557 | B2 | 9/2015 | Fox |
| 9,148,087 | B1 | 9/2015 | Tajalli |
| 9,152,495 | B2 | 10/2015 | Losh |
| 9,165,615 | B2 | 10/2015 | Amirkhany |
| 9,172,412 | B2 | 10/2015 | Kim |
| 9,178,503 | B2 | 11/2015 | Hsieh |
| 9,183,085 | B1 | 11/2015 | Northcott |
| 9,197,470 | B2 | 11/2015 | Okunev |
| 9,281,785 | B2 | 3/2016 | Sjoland |
| 9,288,082 | B1 | 3/2016 | Ulrich |
| 9,288,089 | B2 | 3/2016 | Cronie |
| 9,292,716 | B2 | 3/2016 | Winoto |
| 9,300,503 | B1 | 3/2016 | Holden |
| 9,306,621 | B2 | 4/2016 | Zhang |
| 9,331,962 | B2 | 5/2016 | Lida |
| 9,362,974 | B2 | 6/2016 | Fox |
| 9,363,114 | B2 | 6/2016 | Shokrollahi |
| 9,374,250 | B1 | 6/2016 | Musah |
| 9,401,828 | B2 | 7/2016 | Cronie |
| 9,432,082 | B2 | 8/2016 | Ulrich |

(56) References Cited

U.S. PATENT DOCUMENTS

| | | |
|---|---|---|
| 9,432,298 B1 | 8/2016 | Smith |
| 9,444,654 B2 | 9/2016 | Hormati |
| 9,455,744 B2 | 9/2016 | George |
| 9,455,765 B2 | 9/2016 | Schumacher |
| 9,461,862 B2 | 10/2016 | Holden |
| 9,479,369 B1 | 10/2016 | Shokrollahi |
| 9,509,437 B2 | 11/2016 | Shokrollahi |
| 9,520,883 B2 | 12/2016 | Shibasaki |
| 9,544,015 B2 | 1/2017 | Ulrich |
| 9,634,797 B2 | 4/2017 | Benammar |
| 9,667,379 B2 | 5/2017 | Cronie |
| 9,917,711 B2 | 3/2018 | Ulrich |
| 2001/0006538 A1 | 7/2001 | Simon |
| 2001/0055344 A1 | 12/2001 | Lee |
| 2002/0034191 A1 | 3/2002 | Shattil |
| 2002/0044316 A1 | 4/2002 | Myers |
| 2002/0057592 A1 | 5/2002 | Robb |
| 2002/0154633 A1 | 10/2002 | Shin |
| 2002/0163881 A1 | 11/2002 | Dhong |
| 2002/0167339 A1 | 11/2002 | Chang |
| 2002/0174373 A1 | 11/2002 | Chang |
| 2002/0181607 A1 | 12/2002 | Izumi |
| 2003/0016763 A1 | 1/2003 | Doi |
| 2003/0016770 A1 | 1/2003 | Trans |
| 2003/0046618 A1 | 3/2003 | Collins |
| 2003/0085763 A1 | 5/2003 | Schrodinger |
| 2003/0146783 A1 | 8/2003 | Bandy |
| 2003/0174023 A1 | 9/2003 | Miyasita |
| 2003/0185310 A1 | 10/2003 | Ketchum |
| 2003/0218558 A1 | 11/2003 | Mulder |
| 2004/0027185 A1 | 2/2004 | Fiedler |
| 2004/0146117 A1 | 7/2004 | Subramaniam |
| 2004/0155802 A1 | 8/2004 | Lamy |
| 2004/0161019 A1 | 8/2004 | Raghavan |
| 2004/0169529 A1 | 9/2004 | Afghahi |
| 2004/0170231 A1 | 9/2004 | Bessios |
| 2005/0063493 A1 | 3/2005 | Foster |
| 2005/0134380 A1 | 6/2005 | Nairn |
| 2005/0174841 A1 | 8/2005 | Ho |
| 2005/0195000 A1 | 9/2005 | Parker |
| 2005/0201491 A1 | 9/2005 | Wei |
| 2005/0213686 A1 | 9/2005 | Love |
| 2005/0220182 A1 | 10/2005 | Kuwata |
| 2005/0270098 A1 | 12/2005 | Zhang |
| 2006/0036668 A1 | 2/2006 | Jaussi |
| 2006/0097786 A1 | 5/2006 | Su |
| 2006/0103463 A1 | 5/2006 | Lee |
| 2006/0120486 A1 | 6/2006 | Visalli |
| 2006/0126751 A1 | 6/2006 | Bessios |
| 2006/0133538 A1 | 6/2006 | Stojanovic |
| 2006/0140324 A1 | 6/2006 | Casper |
| 2006/0159005 A1 | 7/2006 | Rawlins |
| 2006/0232461 A1 | 10/2006 | Felder |
| 2006/0233291 A1 | 10/2006 | Garlepp |
| 2006/0291589 A1 | 12/2006 | Eliezer |
| 2007/0001723 A1 | 1/2007 | Lin |
| 2007/0002954 A1 | 1/2007 | Cornelius |
| 2007/0030796 A1 | 2/2007 | Green |
| 2007/0103338 A1 | 5/2007 | Teo |
| 2007/0121716 A1 | 5/2007 | Nagarajan |
| 2007/0176708 A1* | 8/2007 | Otsuka ............... H01P 5/02 333/35 |
| 2007/0182487 A1 | 8/2007 | Ozasa |
| 2007/0201546 A1 | 8/2007 | Lee |
| 2007/0201597 A1 | 8/2007 | He |
| 2007/0204205 A1 | 8/2007 | Niu |
| 2007/0263711 A1 | 11/2007 | Kramer |
| 2007/0283210 A1 | 12/2007 | Prasad |
| 2008/0007367 A1 | 1/2008 | Kim |
| 2008/0012598 A1 | 1/2008 | Mayer |
| 2008/0104374 A1 | 5/2008 | Mohamed |
| 2008/0159448 A1 | 7/2008 | Anim-Appiah |
| 2008/0192621 A1 | 8/2008 | Suehiro |
| 2008/0317188 A1 | 12/2008 | Staszewski |
| 2009/0059782 A1 | 3/2009 | Cole |
| 2009/0115523 A1 | 5/2009 | Akizuki |
| 2009/0154604 A1 | 6/2009 | Lee |
| 2009/0195281 A1 | 8/2009 | Tamura |
| 2009/0262876 A1 | 10/2009 | Arima |
| 2009/0316730 A1 | 12/2009 | Feng |
| 2009/0323864 A1 | 12/2009 | Tired |
| 2010/0046644 A1 | 2/2010 | Mazet |
| 2010/0081451 A1 | 4/2010 | Mueck |
| 2010/0148819 A1 | 6/2010 | Bae |
| 2010/0180143 A1 | 7/2010 | Ware |
| 2010/0215087 A1 | 8/2010 | Tsai |
| 2010/0215112 A1 | 8/2010 | Tsai |
| 2010/0235673 A1 | 9/2010 | Abbasfar |
| 2010/0271107 A1 | 10/2010 | Tran |
| 2010/0283894 A1 | 11/2010 | Horan |
| 2010/0296556 A1 | 11/2010 | Rave |
| 2010/0309964 A1 | 12/2010 | Oh |
| 2011/0014865 A1 | 1/2011 | Seo |
| 2011/0028089 A1 | 2/2011 | Komori |
| 2011/0032977 A1 | 2/2011 | Hsiao |
| 2011/0051854 A1 | 3/2011 | Kizer |
| 2011/0072330 A1 | 3/2011 | Kolze |
| 2011/0074488 A1 | 3/2011 | Broyde |
| 2011/0084737 A1 | 4/2011 | Oh |
| 2011/0103508 A1 | 5/2011 | Mu |
| 2011/0127990 A1 | 6/2011 | Wilson |
| 2011/0156757 A1 | 6/2011 | Hayashi |
| 2011/0228864 A1 | 9/2011 | Aryanfar |
| 2011/0235501 A1 | 9/2011 | Goulahsen |
| 2011/0268225 A1 | 11/2011 | Cronie |
| 2011/0299555 A1 | 12/2011 | Cronie |
| 2011/0302478 A1 | 12/2011 | Cronie |
| 2011/0317559 A1 | 12/2011 | Kern |
| 2012/0082203 A1 | 4/2012 | Zerbe |
| 2012/0125665 A1* | 5/2012 | Masuda ............... H05K 1/024 174/250 |
| 2012/0133438 A1 | 5/2012 | Tsuchi |
| 2012/0152901 A1 | 6/2012 | Nagorny |
| 2012/0161945 A1 | 6/2012 | Single |
| 2012/0213299 A1 | 8/2012 | Cronie |
| 2012/0257683 A1 | 10/2012 | Schwager |
| 2013/0010892 A1 | 1/2013 | Cronie |
| 2013/0013870 A1 | 1/2013 | Cronie |
| 2013/0088274 A1 | 4/2013 | Gu |
| 2013/0106513 A1 | 5/2013 | Cyrusian |
| 2013/0114519 A1 | 5/2013 | Gaal |
| 2013/0114663 A1 | 5/2013 | Ding |
| 2013/0129019 A1 | 5/2013 | Sorrells |
| 2013/0147553 A1 | 6/2013 | Iwamoto |
| 2013/0188656 A1 | 7/2013 | Ferraiolo |
| 2013/0195155 A1 | 8/2013 | Pan |
| 2013/0202065 A1 | 8/2013 | Chmelar |
| 2013/0215954 A1 | 8/2013 | Beukema |
| 2013/0259113 A1 | 10/2013 | Kumar |
| 2013/0271194 A1 | 10/2013 | Pellerano |
| 2013/0307614 A1 | 11/2013 | Dai |
| 2013/0314142 A1 | 11/2013 | Tamura |
| 2013/0315501 A1 | 11/2013 | Atanassov |
| 2013/0346830 A1 | 12/2013 | Ordentlich |
| 2014/0159769 A1 | 6/2014 | Hong |
| 2014/0177645 A1 | 6/2014 | Cronie |
| 2014/0177696 A1 | 6/2014 | Hwang |
| 2014/0266440 A1 | 9/2014 | Itagaki |
| 2014/0269130 A1 | 9/2014 | Maeng |
| 2014/0286381 A1 | 9/2014 | Shibasaki |
| 2015/0049798 A1 | 2/2015 | Hossein |
| 2015/0070201 A1 | 3/2015 | Dedic |
| 2015/0078479 A1 | 3/2015 | Whitby-Strevens |
| 2015/0117579 A1 | 4/2015 | Shibasaki |
| 2015/0146771 A1 | 5/2015 | Walter |
| 2015/0222458 A1 | 8/2015 | Hormati |
| 2015/0249559 A1 | 9/2015 | Shokrollahi |
| 2015/0333940 A1 | 11/2015 | Shokrollahi |
| 2015/0349835 A1 | 12/2015 | Fox |
| 2015/0380087 A1 | 12/2015 | Mittelholzer |
| 2015/0381232 A1 | 12/2015 | Ulrich |
| 2016/0020798 A1 | 1/2016 | Ali Hormati |
| 2016/0020824 A1 | 1/2016 | Ulrich |
| 2016/0036616 A1 | 2/2016 | Holden |

(56) References Cited

U.S. PATENT DOCUMENTS

| | | |
|---|---|---|
| 2016/0197747 A1 | 7/2016 | Ulrich |
| 2016/0261435 A1 | 9/2016 | Musah |
| 2017/0310456 A1 | 10/2017 | Tajalli |
| 2017/0317449 A1 | 11/2017 | Shokrollahi |
| 2017/0317855 A1 | 11/2017 | Shokrollahi |

FOREIGN PATENT DOCUMENTS

| | | |
|---|---|---|
| EP | 1926267 | 5/2008 |
| EP | 2039221 | 2/2013 |
| JP | 2003163612 | 6/2003 |
| WO | 2005002162 | 1/2005 |
| WO | 2009084121 | 7/2009 |
| WO | 2010031824 | 3/2010 |
| WO | 2011119359 | 9/2011 |

OTHER PUBLICATIONS

Shibasaki, et al., "A 56-Gb/s Receiver Front-End with a CTLE and 1-Tap DFE in 20-nm CMOS", IEEE 2014 Symposium on VLSI Circuits Digest of Technical Papers, 2 pgs.

Hidaka, et al., "A 4-Channel 125-10.3 Gb/s Backplane Transceiver Macro With 35 dB Equalizer and Sign-Based Zero-Forcing Adaptive Control", IEEE Journal of Solid-State Circuits, vol. 44 No. 12, Dec. 2009, pp. 3547-3559.

"Introduction to: Analog Computers and the DSPACE System," Course Material ECE 5230 Spring 2008, Utah State University, www.coursehero.com, 12 pages.

Abbasfar, A., "Generalized Differential Vector Signaling", IEEE International Conference on Communications, ICC 09, (Jun. 14, 2009), pp. 1-5.

Brown, L., et al., "V.92: The Last Dial-Up Modem?", IEEE Transactions on Communications, IEEE Service Center, Piscataway, NJ., USA, vol. 52, No. 1, Jan. 1, 2004, pp. 54-61. XP011106836, ISSN: 0090-6779, DOI: 10.1109/tcomm.2003.822168, pp. 55-59.

Burr, "Spherical Codes for M-ARY Code Shift Keying", University of York, Apr. 2, 1989, pp. 67-72, United Kingdom.

Cheng, W., "Memory Bus Encoding for Low Power: A Tutorial", Quality Electronic Design, IEEE, International Symposium on Mar. 26-28, 2001, pp. 199-204, Piscataway, NJ.

Clayton, P., "Introduction to Electromagnetic Compatibility", Wiley-Interscience, 2006.

Counts, L., et al., "One-Chip Slide Rule Works with Logs, Antilogs for Real-Time Processing," Analog Devices computational Products 6, Reprinted from Electronic Design, May 2, 1985, 7 pages.

Dasilva et al., "Multicarrier Orthogonal CDMA Signals for Quasi-Synchronous Communication Systems", IEEE Journal on Selected Areas in Communications, vol. 12, No. 5 (Jun. 1, 1994), pp. 842-852.

Design Brief 208 Using the Anadigm Multiplier CAM, Copyright 2002 Anadigm, 6 pages.

Ericson, T., et al., "Spherical Codes Generated by Binary Partitions of Symmetric Pointsets", IEEE Transactions on Information Theory, vol. 41, No. 1, Jan. 1995, pp. 107-129.

Farzan, K., et al., "Coding Schemes for Chip-to-Chip Interconnect Applications", IEEE Transactions on Very Large Scale Integration (VLSI) Systems, vol. 14, No. 4, Apr. 2006, pp. 393-406.

Grahame, J., "Vintage Analog Computer Kits," posted on Aug. 25, 2006 in Classic Computing, 2 pages, http://www.retrothing.com/2006/08/classic_analog_html.

Healey, A., et al., "A Comparison of 25 Gbps NRZ & PAM-4 Modulation used in Legacy & Premium Backplane channels", DesignCon 2012, 16 pages.

International Search Report and Written Opinion for PCT/EP2011/059279 dated Sep. 22, 2011.

International Search Report and Written Opinion for PCT/EP2011/074219 dated Jul. 4, 2012.

International Search Report and Written Opinion for PCT/EP2012/052767 dated May 11, 2012.

International Search Report and Written Opinion for PCT/US14/052986 dated Nov. 24, 2014.

International Search Report and Written Opinion from PCT/US2014/034220 dated Aug. 21, 2014.

International Search Report and Written Opinion of the International Searching Authority, dated Jul. 14, 2011 in International Patent Application S.N. PCT/EP2011/002170, 10 pages.

International Search Report and Written Opinion of the International Searching Authority, dated Nov. 5, 2012, in International Patent Application S.N. PCT/EP2012/052767, 7 pages.

International Search Report for PCT/US20141053563, dated Nov. 11, 2014, 2 pages.

Jiang, A., et al., "Rank Modulation for Flash Memories", IEEE Transactions of Information Theory, Jun. 2006, vol. 55, No. 6, pp. 2659-2673.

Loh, M., et al., "A 3×9 Gb/s Shared, All-Digital CDR for High-Speed, High-Density I/O", Matthew Loh, IEEE Journal of Solid-State Circuits, Vo. 47, No. 3, Mar. 2012.

Notification of Transmittal of International Search Report and The Written Opinion of the International Searching Authority, for PCT/US2015/018363, dated Jun. 18, 2015, 13 pages.

Notification of Transmittal of The International Search Report and The Written Opinion of the International Searching Authority, or The Declaration for PCT/EP2013/002681, dated Feb. 25, 2014, 15 pages.

Notification of Transmittal of The International Search Report and The Written Opinion of the International Searching Authority, or The Declaration, dated Mar. 3, 2015, for PCT/US2014/066893, 9 pages.

Notification of Transmittal of The International Search Report and The Written Opinion of the International Searching Authority, or the Declaration, for PCT/US2014/015840, dated May 20, 2014. 11 pages.

Notification of Transmittal of The International Search Report and The Written Opinion of the International Searching Authority, or the Declaration, for PCT/US2014/043965, dated Oct. 22, 2014, 10 pages.

Notification of Transmittal of the International Search Report and the Written Opinion of the International Searching Authority, or the Declaration, for PCT/US2015/037466, dated Nov. 19, 2015.

Notification of Transmittal of the International Search Report and The Written Opinion of the International Searching Authority, or the Declaration, for PCT/US2015/039952, dated Sep. 23, 2015, 8 pages.

Notification of Transmittal of the International Search Report and the Written Opinion of the International Searching Authority, or the Declaration, for PCT/US2015/041161, dated Oct. 7, 2015, 8 pages.

Notification of Transmittal of the International Search Report and the Written Opinion of the International Searching Authority, or the Declaration, for PCT/US2015/043463, dated Oct. 16, 2015, 8 pages.

Oh, et al., Pseudo-Differential Vector Signaling for Noise Reduction in Single-Ended Signaling, DesignCon 2009.

Poulton, et al., "Multiwire Differential Signaling", UNC—CH Department of Computer Science Version 1.1, Aug. 6, 2003.

Schneider, J., et al., "ELEC301 Project: Building an Analog Computer," Dec. 19, 1999, 8 pages, http://www.clear.rice.edu/elec301/Projects99/anlgcomp/.

She et al., "A Framework of Cross-Layer Superposition Coded Multicast for Robust IPTV Services over WiMAX," IEEE Communications Society subject matter experts for publication in the WCNC 2008 proceedings, Mar. 31, 2008-Apr. 3, 2008, pp. 3139-3144.

Skliar et al., A Method for the Analysis of Signals: the Square-Wave Method, Mar. 2008, Revista de Matematica: Teoria y Aplicationes, pp. 109-129.

Slepian, D., "Premutation Modulation", IEEE, vol. 52, No. 3, Mar. 1965, pp. 228-236.

Stan, M., et al., "Bus-Invert Coding for Low-Power I/O, IEEE Transactions on Very Large Scale Integration (VLSI) Systems", vol. 3, No. 1, Mar. 1995, pp. 49-58.

Tallini, L., et al., "Transmission Time Analysis for the Parallel Asynchronous Communication Scheme", IEEE Transactions on Computers, vol. 52, No. 5, May 2003, pp. 558-571.

(56) References Cited

OTHER PUBLICATIONS

Tierney, J., et al., "A digital frequency synthesizer," Audio and Electroacoustics, IEEE Transactions, Mar. 1971, pp. 18-57, vol. 19, Issue 1, 1 page Abstract from http://ieeexplore.
Wang et al., "Applying CDMA Technique to Network-on-Chip", IEEE Transactions on Very Large Scale Integration (VLSI) Systems, vol. 15, No. 10 (Oct. 1, 2007), pp. 1091-1100.
Zouhair Ben-Neticha et al, "The 'streTched"-Golay and other codes for high-SNR fnite-delay quantization of the Gaussian source at ½ Bit per sample, IEEE Transactions on Communications, vol. 38, No. 12 Dec. 1, 1990, pp. 2089-2093, XP000203339, ISSN: 0090-6678, DOI: 10.1109/26.64647.
Notification of Transmittal of the International Search Report and The Written Opinion of the International Searching Authority, or the Declaration, dated Feb. 15, 2017, 10 pages.
Notification of Transmittal of the International Search Report and the Written Opinion of the International Searching Authority, or the Declaration., for PCT/US17/14997, dated Apr. 7, 2017.
Holden, B., "Simulation results for NRZ, ENRZ & PAM-4 on 16-wire full-sized 400GE backplanes", IEEE 802.3 400GE Study Group, Sep. 2, 2013, 19 pages, www.ieee802.0rg/3/400GSG/publiv/13_09/holden_400_01_0913.pdf.
Holden, B., "An exploration of the technical feasibility of the major technology options for 400GE backplanes", IEEE 802.3 400GE Study Group, Jul. 16, 2013, 18 pages, http://ieee802.org/3/400GSG/public/13_07/holden_400_01_0713.pdf.
Holden, B., "Using Ensemble NRZ Coding for 400GE Electrical Interfaces", IEEE 8023 400GE Study Group, May 17, 2013, 24 pages, http://www.ieee802.org/3/400GSG/public/13_05/holden_400_01_0513.pdf.

\* cited by examiner

SKEW-RESISTANT MULTI-WIRE CHANNEL

CROSS REFERENCE TO RELATED APPLICATIONS

This application claims the benefit of U.S. Provisional Application No. 62/328,735, filed Apr. 28, 2016, entitled "SKEW-RESISTANT MULTI-WIRE CHANNEL", reference of which is hereby incorporated in its entirety.

REFERENCES

The following prior applications are herein incorporated by reference in their entirety for all purposes:

U.S. Pat. No. 9,100,232, filed Feb. 2, 2015 and issued Aug. 4, 2015, naming Ali Hormati, Amin Shokrollahi, and Roger Ulrich, entitled "Method and Apparatus for Low Power Chip-to-Chip Communications with Constrained ISI Ratio," hereinafter [Hormati I].

U.S. Pat. No. 9,596,109, filed Apr. 15, 2014 and issued Apr. 14, 2017, naming John Fox, Brian Holden, Ali Hormati, Peter Hunt, John D Keay, Amin Shokrollahi, Anant Singh, Andrew Kevin John Stewart, Giuseppe Surace, and Roger Ulrich, entitled "Methods and Systems for High Bandwidth Communications Interface," hereinafter [Fox I].

BACKGROUND

In modern digital systems, digital information has to be processed in a reliable and efficient way. In this context, digital information is to be understood as information available in discrete, i.e., discontinuous values. Bits, collection of bits, but also numbers from a finite set can be used to represent digital information.

In most chip-to-chip, or device-to-device communication systems, communication takes place over a plurality of wires to increase the aggregate bandwidth. A single or pair of these wires may be referred to as a channel or link and multiple channels create a communication bus between the electronic components. At the physical circuitry level, in chip-to-chip communication systems, buses are typically made of electrical conductors in the package between chips and motherboards, on printed circuit boards ("PCBs") boards or in cables and connectors between PCBs. In high frequency applications, microstrip or stripline PCB traces may be used.

Common methods for transmitting signals over bus wires include single-ended and differential signaling methods. In applications requiring high speed communications, those methods can be further optimized in terms of power consumption and pin-efficiency, especially in high-speed communications. More recently, vector-signaling methods have been proposed to further optimize the trade-offs between power consumption, pin efficiency and noise robustness of chip-to-chip communication systems. In those vector signaling systems, the digital information is transformed into a different representation space in the form of a vector codeword that is chosen in order to optimize the power consumption, pin-efficiency and speed trade-offs based on the transmission channel properties and communication system design constraints. Herein, this process is referred to as "encoding". At the receiver side, the received signals corresponding to the codeword are transformed back into the original digital information representation space. Herein, this process is referred to as "decoding".

BRIEF DESCRIPTION

Methods and systems are described for obtaining a set of information signals and responsively generating symbols of a multi-level vector signaling codeword, the multi-level vector signaling codeword representing a sum of a plurality of orthogonal sub-channel vectors, each sub-channel vector having an associated weight determined by a corresponding information signal, and transmitting the symbols of the codeword over a multi-wire skew-balanced channel, the multi-wire skew-balanced channel having (i) a plurality of conductors, each conductor for carrying a respective symbol of the multi-level vector signaling codeword and (ii) at least first and second dielectric materials interposed between the plurality conductors to offset coupling mismatches associated with geometric mismatches between the plurality of conductors.

In some embodiments, a multi-wire skew-balanced channel include a first dielectric material having a plurality of embedded conductors of a multi-wire channel, the plurality of embedded conductors comprising at least a first, second and third conductor, wherein a first distance between the first and second conductors is less than a second distance between the first and third conductors, wherein the first dielectric material has a first dielectric constant $\varepsilon_1$ and a second dielectric material embedded in the first dielectric material, the second dielectric material embedded in between the first and third conductors, the second dielectric material having a second dielectric constant $\varepsilon_2$, wherein $\varepsilon_2 > \varepsilon_1$.

DETAILED DESCRIPTION

Figure 1A:
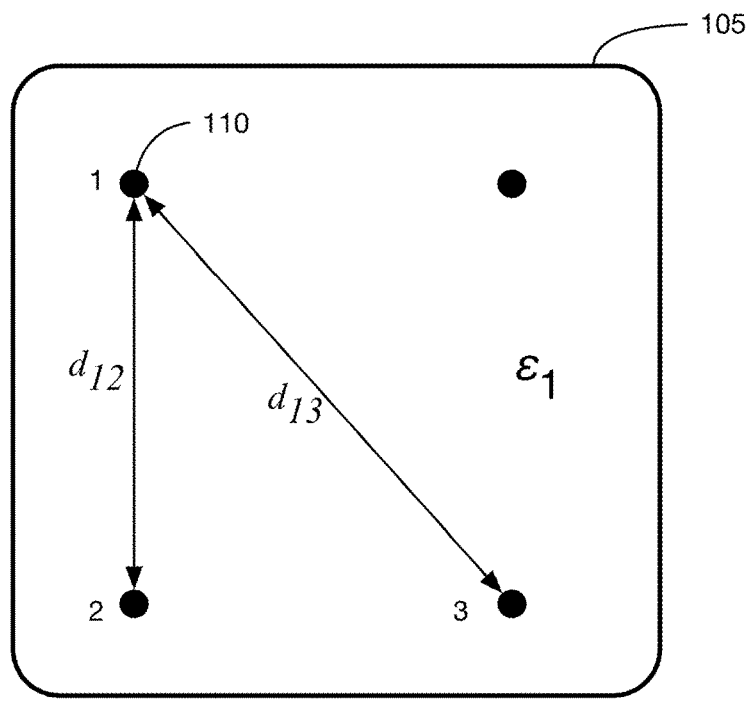
FIGS. 1A and 1B illustrate an exemplary four-wire channel.
Figure 1B:
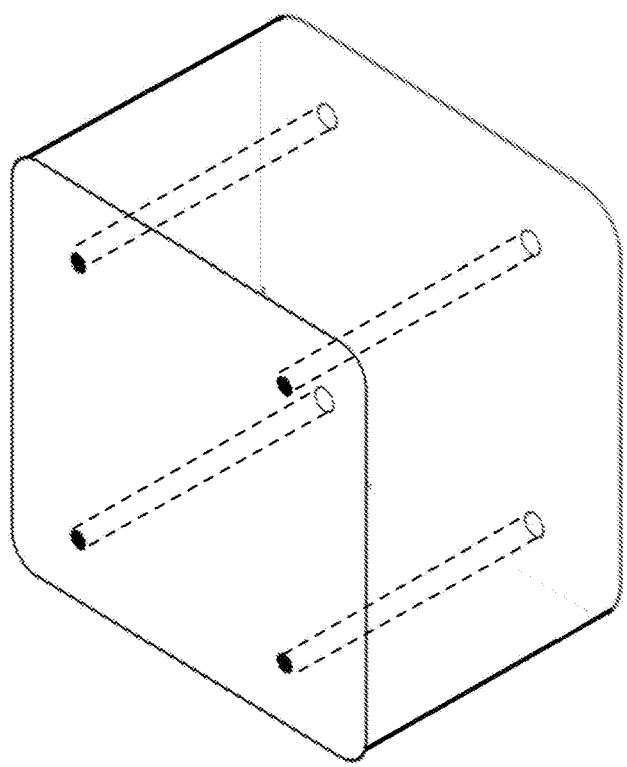

Embodiments are described herein for reducing skew in a multi-wire channel by adjusting signal propagation speed through the use of dielectric materials. In vector signaling embodiments, wire skew and a capacitive coupling mismatch for a given chord of three or more symbols may be introduced if there are varying distances between any three wires. Correcting for skew in vector signaling may improve performance as each conductor is carrying a symbol of the chord, rather than being part of a differential pair. By matching the capacitive coupling between the conductors, the skew between the symbols of the chord may be reduced, providing more accurate and reliable detection of encoded data. FIGS. 1A and 1B illustrate an exemplary four-wire channel. As shown, FIG. 1A includes a first dielectric material 105 having a dielectric constant $\varepsilon_1$, and four signal conductors 110. The signal conductors may pass through the dielectric material 105, as shown in FIG. 1B. In some embodiments, dielectric material 105 may be a cavity of air (enclosed by a plastic housing, for example), or various other gases having various possible dielectric constants $\varepsilon$. Alternatively, the dielectric material 105 may be a solid material, such as plastic, or any other dielectric materials known to those of skill in the art.

As shown in FIG. 1A, the distance between conductor 1 and adjacent conductor 2 is $d_{12}$, while the distance between conductor 1 and diagonal conductor 3 is $d_{13}$. It is evident in FIG. 1A that $d_{12} < d_{13}$. As known to those of skill in the art, the velocity factor (VF; the ratio of the speed at which a waveform passes through a medium to the speed of light in a vacuum) is inversely proportional to the square root of the dielectric constant k, as shown below in Eqn. 1:

$$VF = \frac{1}{\sqrt{k}} \quad \text{(Eqn. 1)}$$

However, it can also be shown that VF may be related to the capacitance C between conductors:

$$VF = \frac{1}{c\sqrt{LC}} \quad \text{(Eqn. 2)}$$

where L is the distributed inductance, C is the capacitance between the conductors, and c is the speed of light in a vacuum. Further, as capacitance between two conductors is inversely proportional to the distance d between them:

$$\left( C = \frac{\pi \varepsilon}{\ln\left(\frac{d}{a}\right)} \right) \quad \text{(Eqn. 3)}$$

where d is the distance between the conductors and a is the area of the of the cross-section of the conductors, then the capacitance $C_{12}$ between conductors 1 and 2 will be larger than the capacitance $C_{13}$ between conductors 1 and 3 when $d_{12} < d_{13}$. Following this observation, it can be derived that the velocity factor between conductors 1 and 2 (denoted $VF_{12}$) will be less than the $VF_{13}$ between conductors 1 and 3. Such a difference in capacitive coupling and VF may cause skew to appear at the end of the channel, and may result in the symbols of the vector signaling codeword to be received at the end of the channel at skewed times. By equalizing the capacitive coupling such that $C_{12} = C_{13}$, the skew at the end of the channel may be reduced, among other beneficial transmission characteristics.

Figure 2:
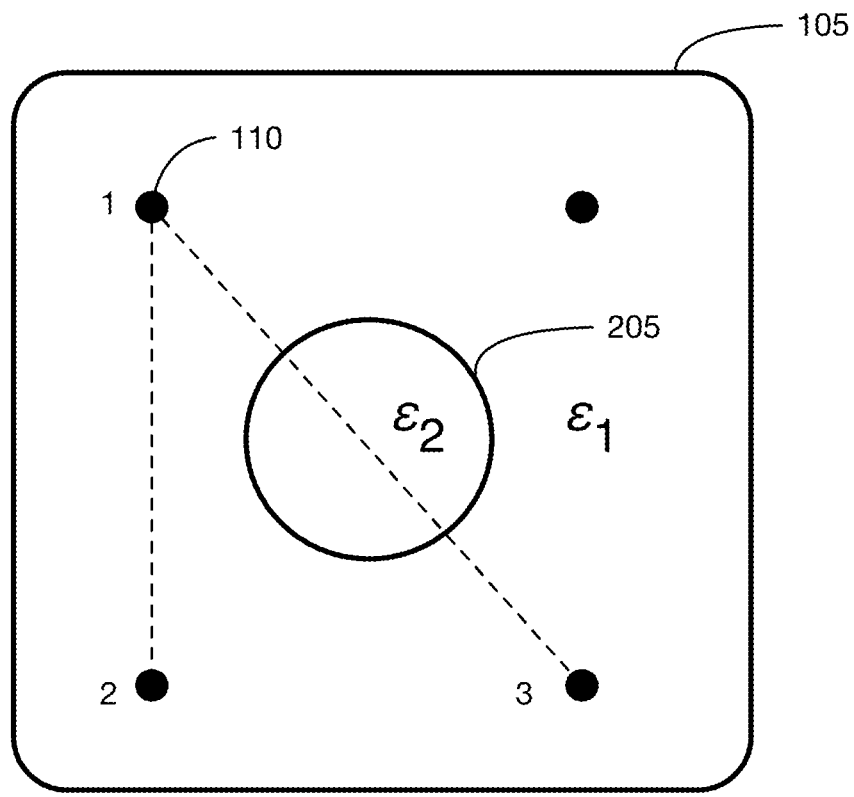
FIG. 2 illustrates an exemplary skew-resistant four-wire channel with first and second dielectric materials, in accordance with some embodiments.

In some embodiments, skew is introduced due to geometric mismatches regarding the conductors. In some embodiments, the geometric mismatches may correspond to varying distances between pairs of conductors, surface areas of the cross sections of conductors, or various other aspects regarding the design/layout of the multi-wire channel. In some embodiments, the skew introduced by such geometric mismatches may be offset by equalizing capacitive coupling between all conductors in the channel. In some embodiments, equalizing the capacitive coupling can be done by inserting a second dielectric material having a dielectric constant of $\varepsilon_2$ in between conductors 1 and 3, where $\varepsilon_2 > \varepsilon_1$, which will offset the mismatch caused by the geometric (i.e., spatial distance) mismatch. By selecting a dielectric material having a dielectric constant $\varepsilon_2$, $VF_{13}$ may be reduced until $VF_{13} = VF_{12}$, according to Eqn. 1 above. Alternatively, $\varepsilon_2$ may be fixed, while the dielectric material 105 is selected to have a $\varepsilon_1$ that is less than $\varepsilon_2$, thus increasing $VF_{12}$ until it is equal to $VF_{13}$. FIG. 2 illustrates an example skew-tolerant four-wire channel, in accordance with some embodiments. As shown, FIG. 2 is similar to the four-wire channel shown in FIG. 1A, with the addition of the dielectric material 205 having dielectric constant $\varepsilon_2$ inserted into the middle of dielectric material $\varepsilon_1$. As one will observe, the dielectric constant between conductors 1 and 2 remains $\varepsilon_1$, while the effective dielectric constant between conductors 1 and 3 is a combination of $\varepsilon_1$ and $\varepsilon_2$. In some embodiments, the effective combination may be tuned (e.g., adjusting the capacitance seen between conductors) until $VF_{13} = VF_{12}$, for instance, by selecting a material having a larger or smaller relative dielectric constant $\varepsilon_2$. Alternatively, a diameter of dielectric material 205 may be adjusted in order to tune the effective combination of $\varepsilon_1$ and $\varepsilon_2$. It should be noted that although dielectric material 205 is shown as a cylinder, this should not be considered limiting, and tuning the effective combination of $\varepsilon_1$ and $\varepsilon_2$ may include adjusting other size parameters such as width or length, if a square/rectangle is used, for example.

Figure 3A:
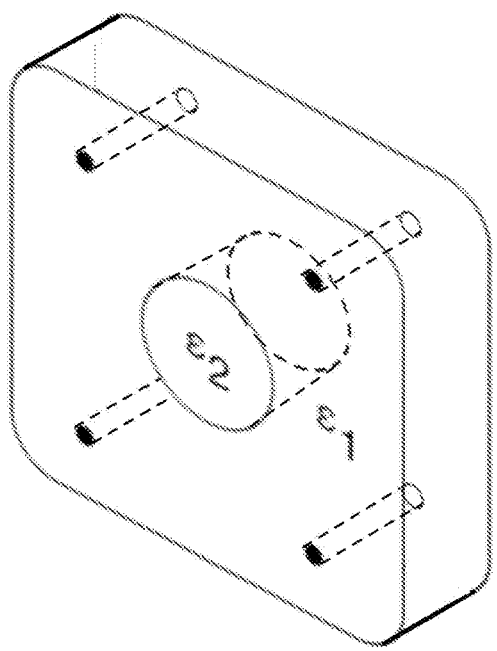
FIGS. 3A and 3B illustrate various lengths of the skew-resistant four-wire channel of FIG. 2, in accordance with some embodiments.
Figure 3B:
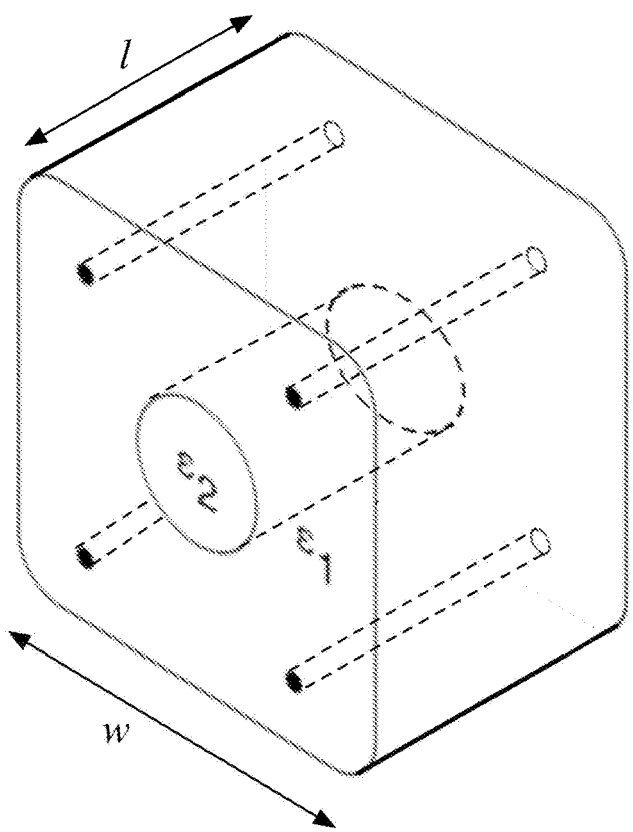
Figure 4A:
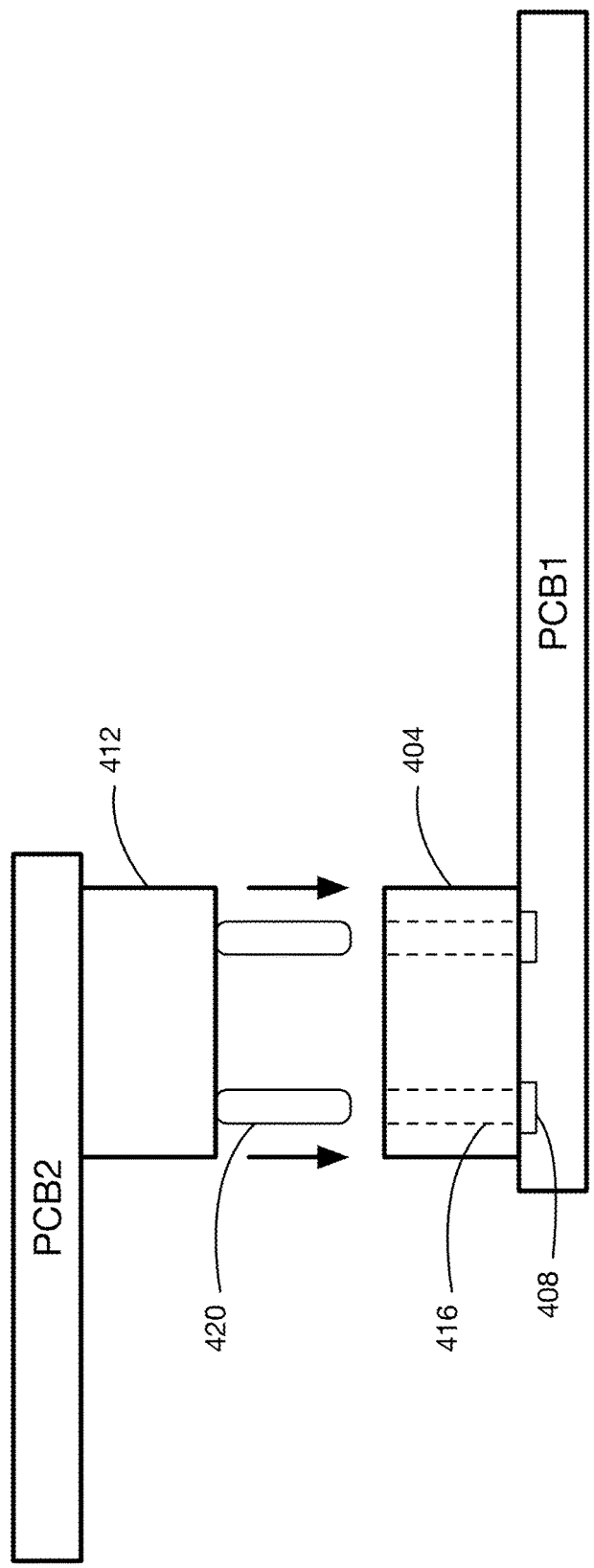
FIGS. 4A and 4B illustrate exemplary connection interfaces, in accordance with some embodiments.
Figure 4B:
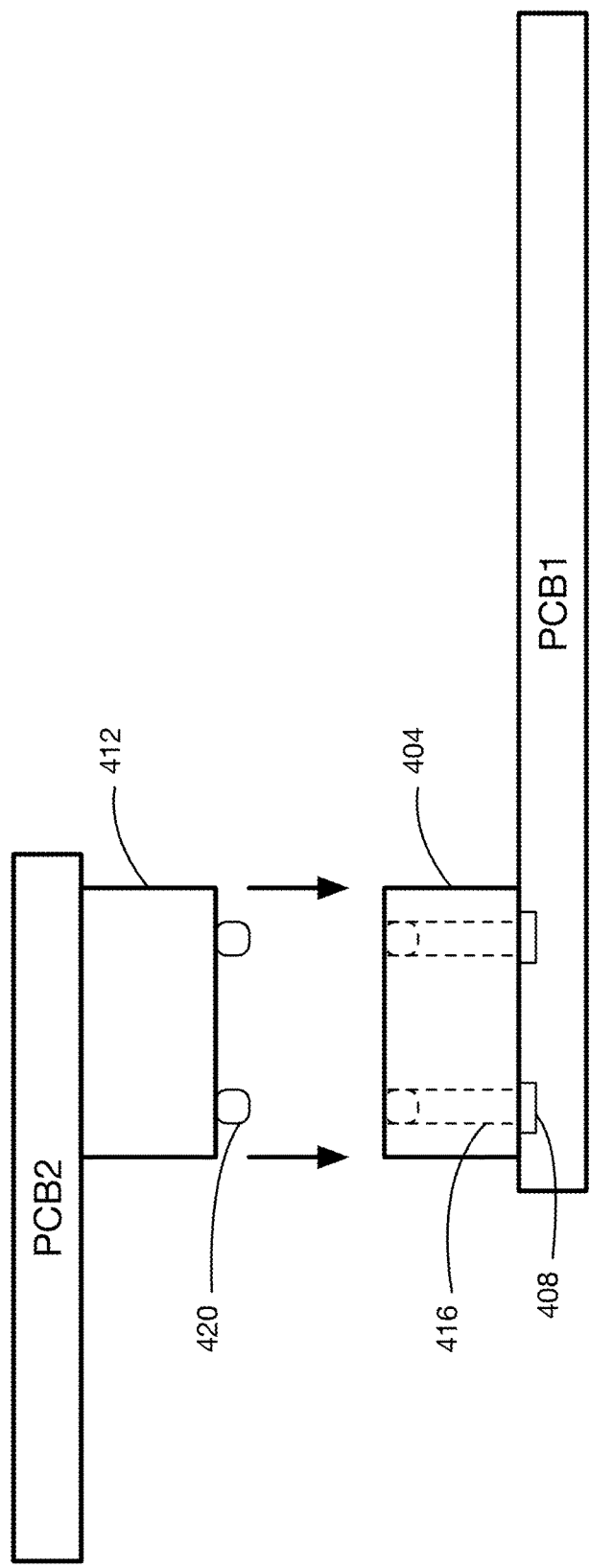

FIGS. 3A and 3B illustrate skew-tolerant four-wire channels having various lengths, in accordance with some embodiments. As shown, the four signal conductors as well as dielectric material 205 penetrate fully through dielectric material 105. FIG. 3B shows the length l of the channel being approximately equal to the width w, while FIG. 3A shows the length l being shorter than width w. In some embodiments, the l and w are on the order of millimeters. In such embodiments, the channel may be used as a connector between 2 printed circuit boards (PCBs), as shown in FIGS. 4A and 4B, and described below. In some embodiments, the above-described method may also be applied to a channel taking the form of a cable, in which case l >> w.

FIG. 4A illustrates an exemplary connection interface, in accordance with some embodiments. As shown, the skew-tolerant channel 404 is attached to PCB1, which may be a computer motherboard, without implying limitation. PCB2 (which may be a graphics processing unit or memory device, without implying limitation) is shown to have a connector 412 attached, including pins 420. In some embodiments, the pins 420 act as the signal conductors, and are inserted into holes 416, and make direct contact with PCB1's pads (or contacts) 408. In some embodiments, holes 416 may include conducting sleeves, which may be soldered to contacts 408, while the conducting sleeves maintain a connection to pins 420. FIG. 4B illustrates an alternative connection interface, in accordance with some embodiments. FIG. 4B is similar to FIG. 4A, except that skew-tolerant channel 404 includes conducting material in holes 416, and connector 412 on PCB2 includes short pins that make a direct contact to the conducting material in hole 416.

Figure 5:
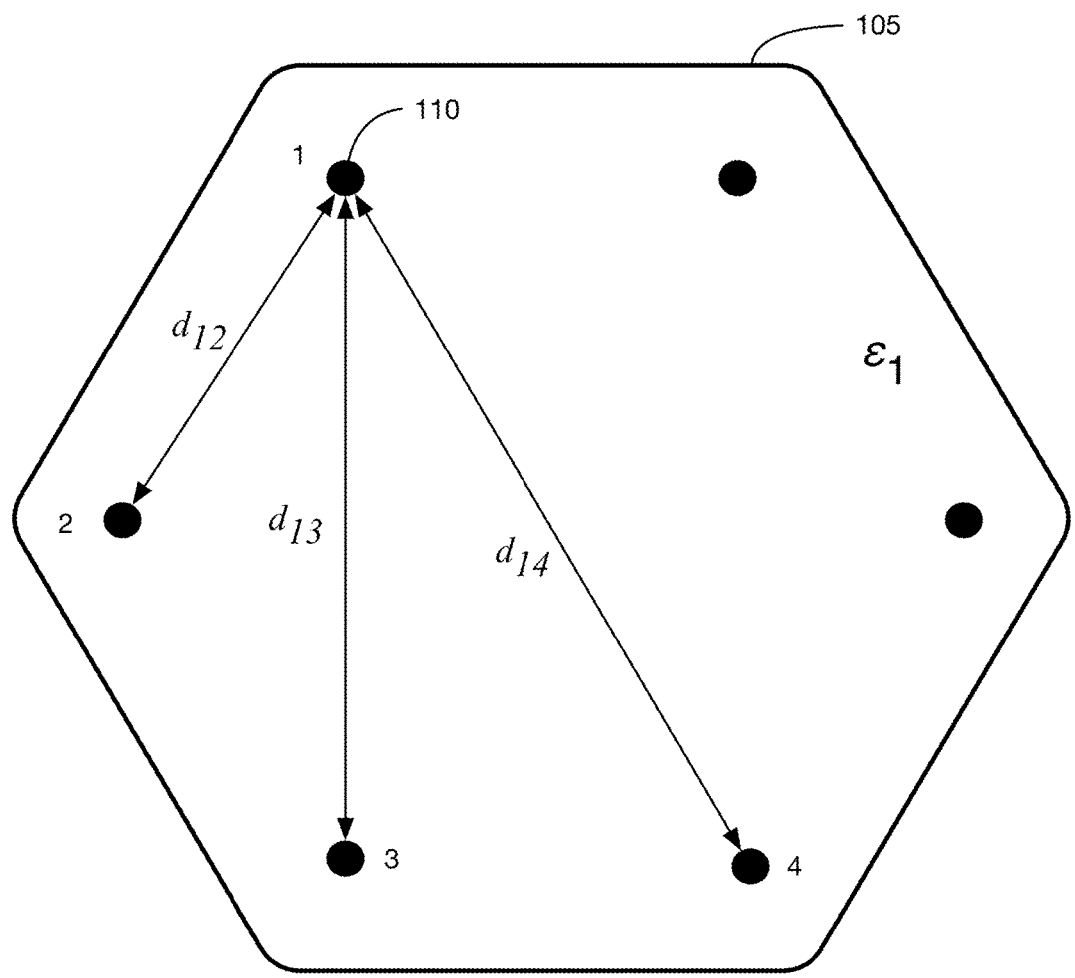
FIG. 5 illustrates an exemplary skew-resistant six-wire channel, in accordance with some embodiments.
Figure 6:
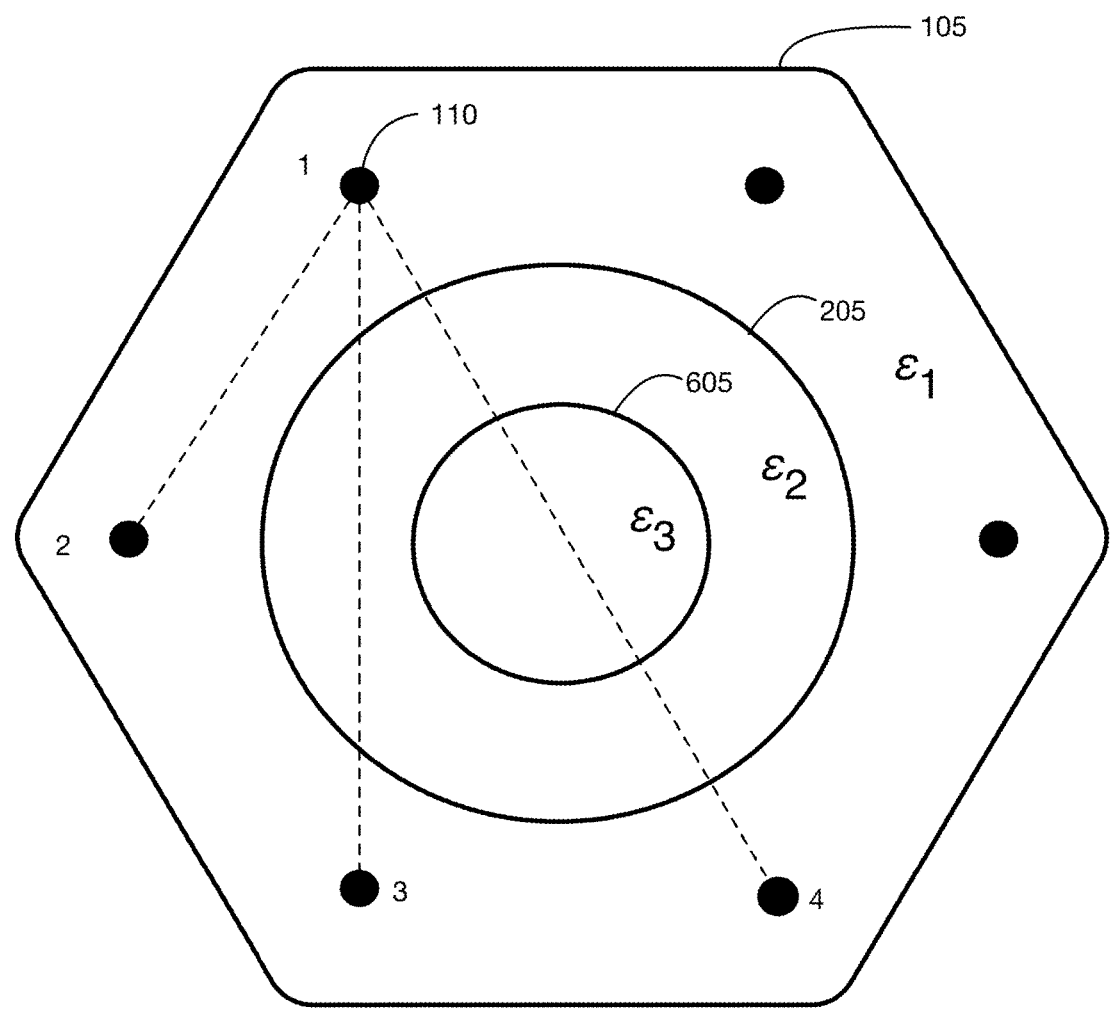
FIG. 6 illustrates the skew-resistant six-wire channel of FIG. 5 including first second and third dielectric materials, in accordance with some embodiments.

The above examples describe a simple case of a multi-wire skew-balanced channel, however such embodiments should not be considered limiting. FIG. 5 illustrates an exemplary six-wire channel. As shown in FIG. 5, there are three different distances: $d_{12} < d_{13} < d_{14}$. Using similar techniques described above, the signal propagation speed (or velocity factors) between conductors 1/2, 1/3, and 1/4 may be matched by including additional dielectric materials. FIG. 6 illustrates a skew-tolerant six-wire channel, in accordance with some embodiments. As shown, FIG. 6 includes a first dielectric material 105 having dielectric constant $\varepsilon_1$, a second dielectric material 205 having dielectric constant $\varepsilon_2$, and a third dielectric material 605 having dielectric constant $\varepsilon_3$. Following the above procedures, it may be derived that $\varepsilon_3 > \varepsilon_2 > \varepsilon_1$. As shown in FIG. 6, the coupling between conductors 1 and 2 is affected by only the first dielectric material 105, the coupling between conductors 1 and 3 is affected by the first and second dielectric materials 105 and 205, respectively, while the coupling between conductors 1 and 4 is affected by the first, second and third dielectric materials 105, 205, and 605, respectively. Thus, each of the dielectric materials may be tuned to achieve equal mutual capacitance between any pair of wires, and to achieve equal VFs between each pair of conductors using techniques described above.

Figure 7A:
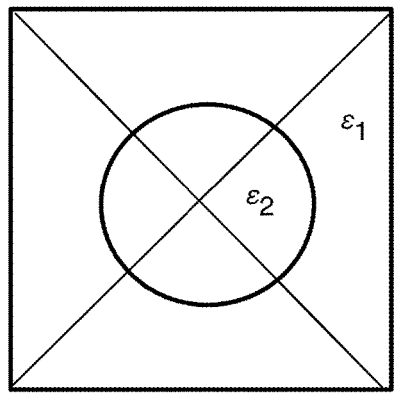
FIGS. 7A-7E depict various conductor arrangements, in accordance with some embodiments.
Figure 7B:
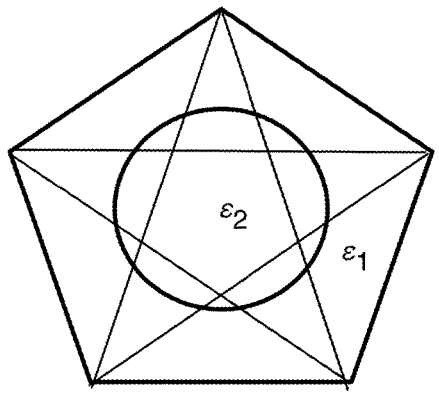
Figure 7C:
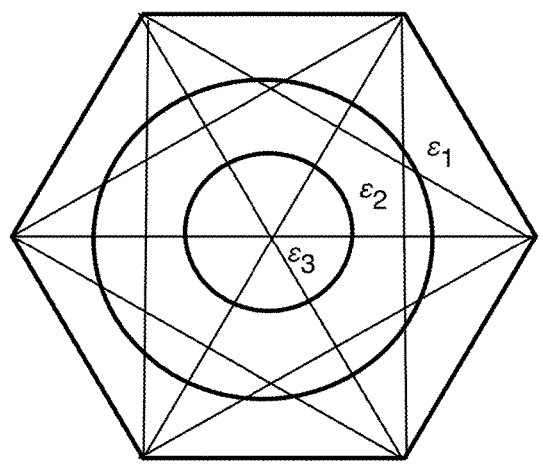
Figure 7D:
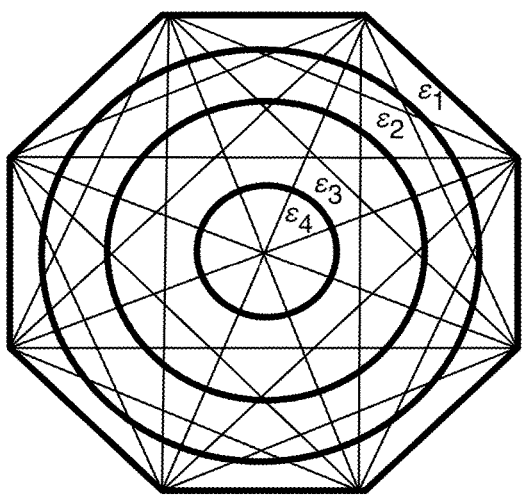
Figure 7E:
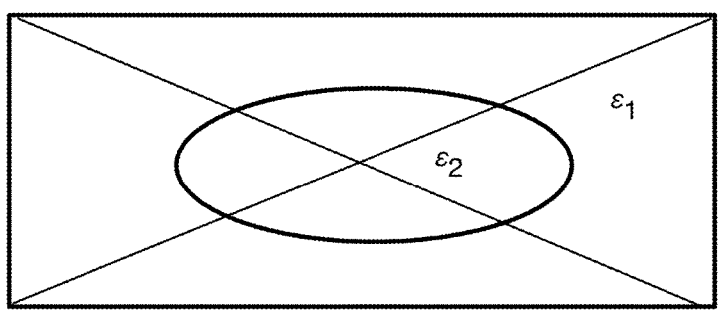

In some embodiments, for n wires arranged in a regular n-gon, a number of different distances k is equal to floor(n/2), where floor(x) is the largest integer <=x. In some embodiments, k concentric circles of dielectric materials having dielectric constant $\varepsilon_m$ may be inserted into the n-gon such that the direct line between a vertex v and a vertex w passes through the k-th inter circle if the distance between v and w is the (k+1)-th smallest distance, where k is an integer 0<k<floor(n/2)−1, and does not pass through the (k+1)-th inner circle. FIGS. 7A-7D depicts various n-gons including a square (n=4), a pentagon (n=5), a hexagon (n=6) and an octagon (n=8), respectively. It should also be noted that embodiments described above have points representing vertices on a circle, however in alternative embodiments, this may not be the case. In such embodiments, the shape of the dielectrics may be adjusted, as shown in FIG. 7E, where the conductors are vertices on a rectangle. Other possible shapes the conductors may be arranged in may include trapezoids, ovals, and triangles, as well as any other shapes known to those of skill in the art.

In some embodiments, a skew-balanced bus as described above may be equipped with (or connected to) a transceiver configured to encode received information signals into codewords of a vector signaling code. In some embodiments, the transceiver may be adapted to receive information bits from a first type of interface (USB-C) or similar interfaces having a prior art signaling scheme, such as non-return to zero (NRZ), and may convert the received information bits to multi-level vector signaling codewords for transmission. Further, a cable incorporating a skew-balanced bus as described above may include a single transceiver at one end of the cable, or alternatively at each end of the cable may include a transceiver.

Figure 8:
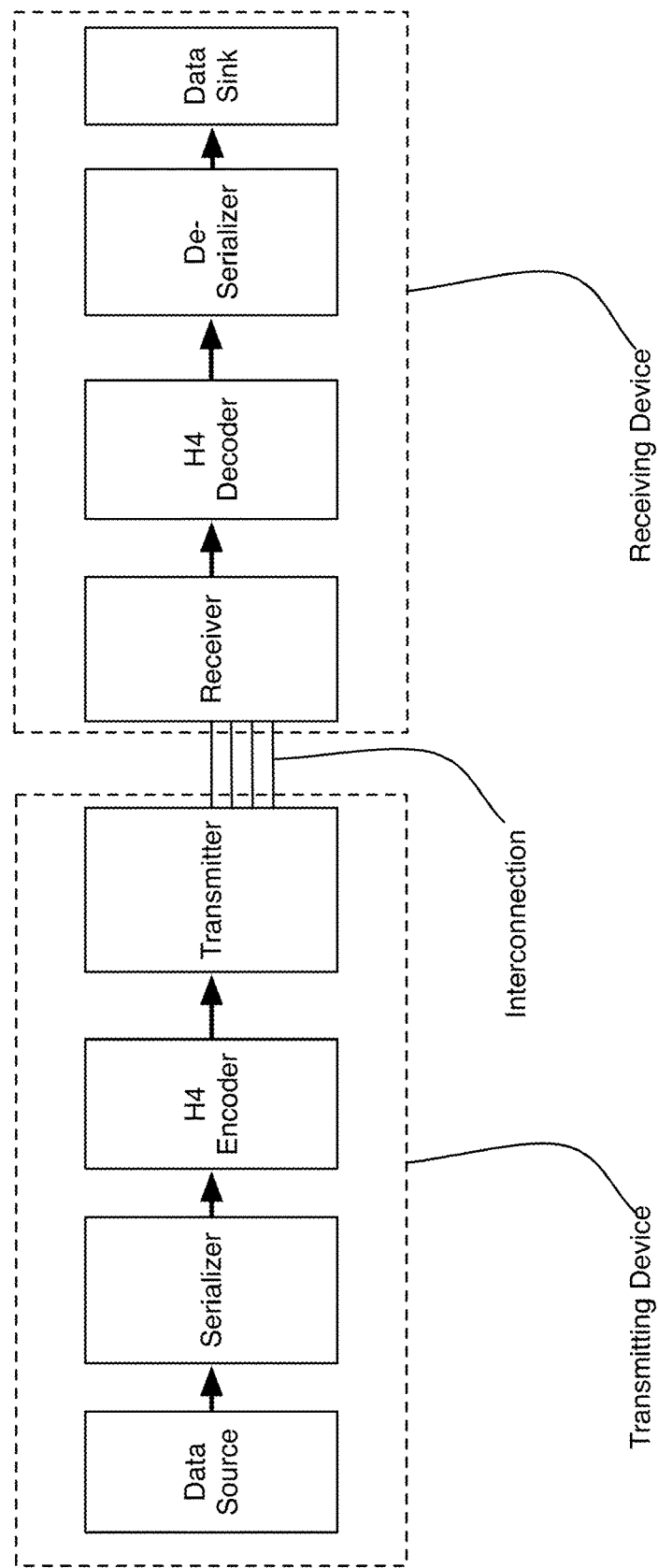
FIG. 8 is a block diagram of a system comprised of a Transmitting Device, Interconnection, and Receiving Device.

FIG. 8 is a block diagram of a system comprised of a transmitting device, interconnection, and receiving device. The data source may be a host computing device, or an adapter or transceiver supporting another interface type. The data sink may also be a host computing device, or an adapter or transceiver supporting another interface type. As a non-limiting example, FIG. 8 shows the Data Source co-located with the transmitter within the transmitting device, and the data sink co-located with the receiver within the receiving device.

Figure 9:
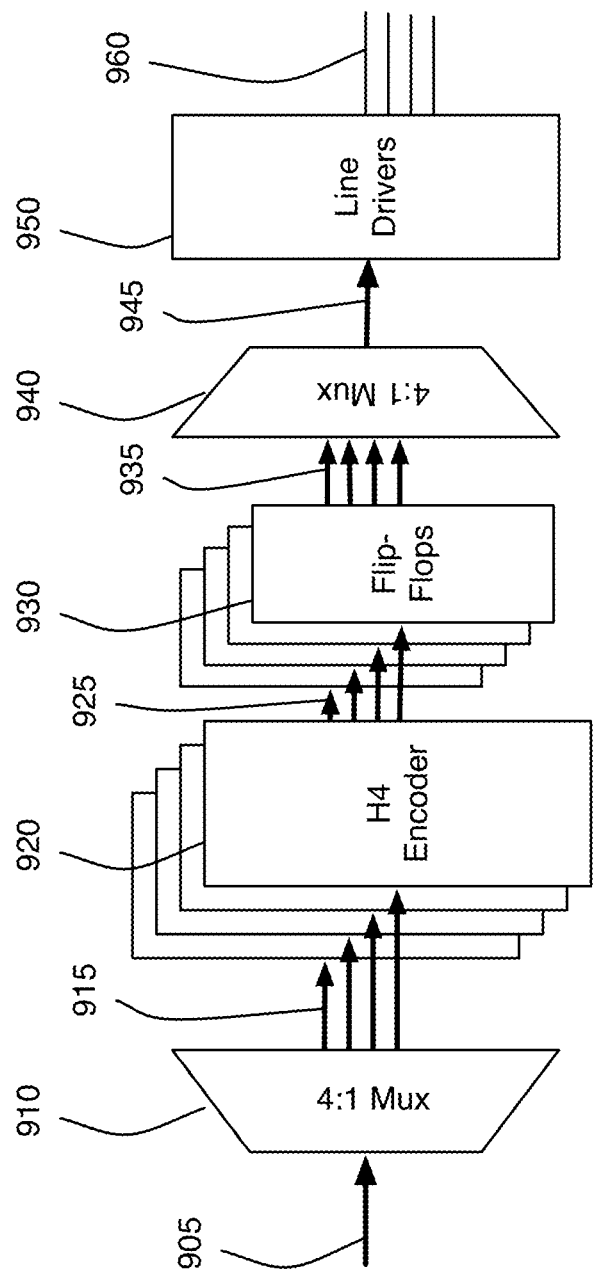
FIG. 9 illustrates one embodiment of a Transmitting Device utilizing multiple processing phases for H4 encoding.

FIG. 9 illustrates one embodiment of a transmitting device utilizing multiple processing phases for H4 (also referred to as ENRZ) encoding. As described by [Fox I], the H4 vector signaling code encodes three data bits for transmission over four wires. At very high communication rates, multiple instances of such encoders may execute essentially in parallel as distinct processing phases of a multi-phase encoder. At lower data rates, a single processing instance may suffice. In some embodiments, a skew-balanced multi-wire bus may include a transceiver having the components or a subset of the components of the transmitting device of FIG. 9.

Figure 10A:
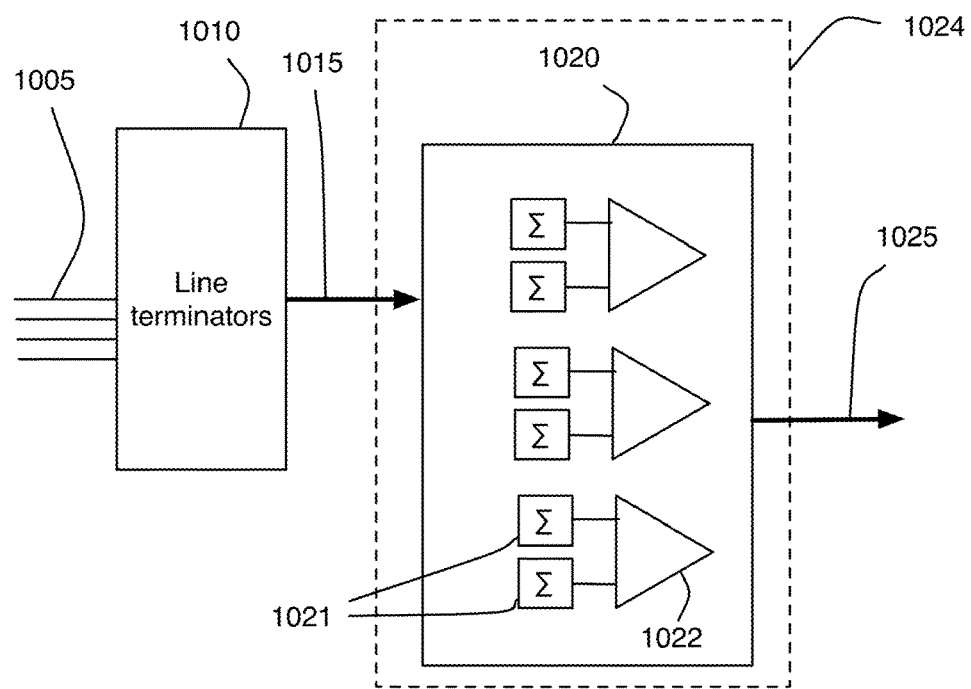
FIG. 10A illustrates one embodiment of a receiving device, with FIG. 10B showing additional details of that embodiment's use of multiple processing phases for H4 decoding.
Figure 10B:
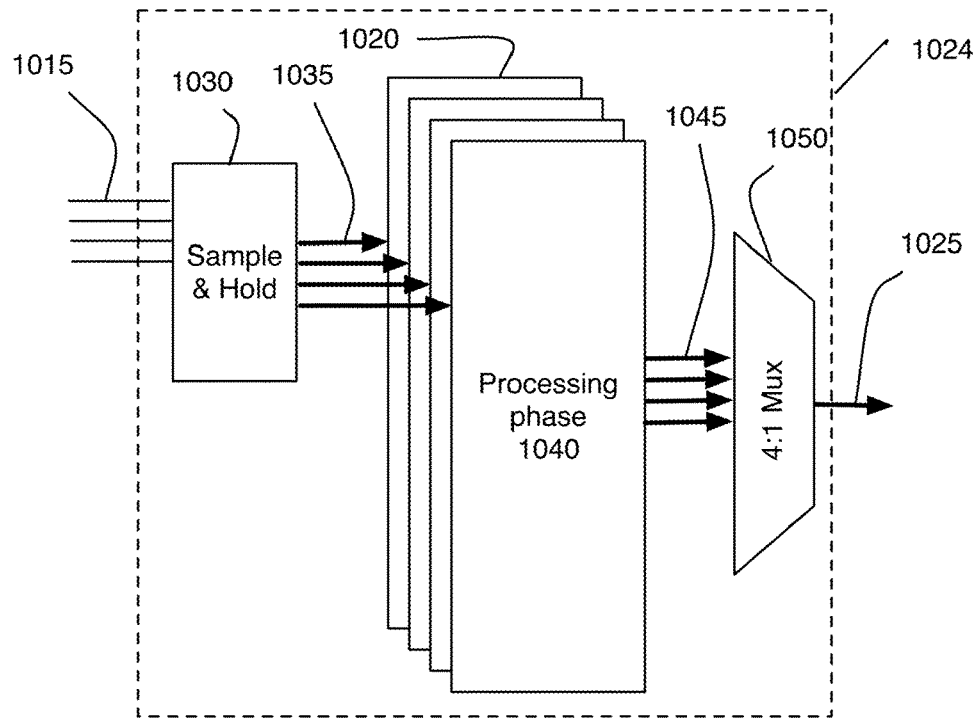

FIG. 10A illustrates one embodiment of a receiving device. [Fox I] also describes use of multi-input comparators (MIC) as vector signaling code decoders. Each H4 decoding MIC is comprised of two summation elements 1021, and one difference or comparison element 1022. Three MICS are sufficient 1020 to fully decode the three received bits 1025 of the H4 code. As with the previously described transmitter, multiple processing phases may be applied to the receiver to support very high communication rates. FIG. 10B shows additional details of an embodiment utilizing multiple processing phases 1020 for H4 decoding. Lower communication rates may be supported by fewer, or a single processing phase. In some embodiments, a skew-balanced multi-wire bus may include a transceiver having the components or a subset of the components of the receiving device of FIG. 9.

Figure 11:
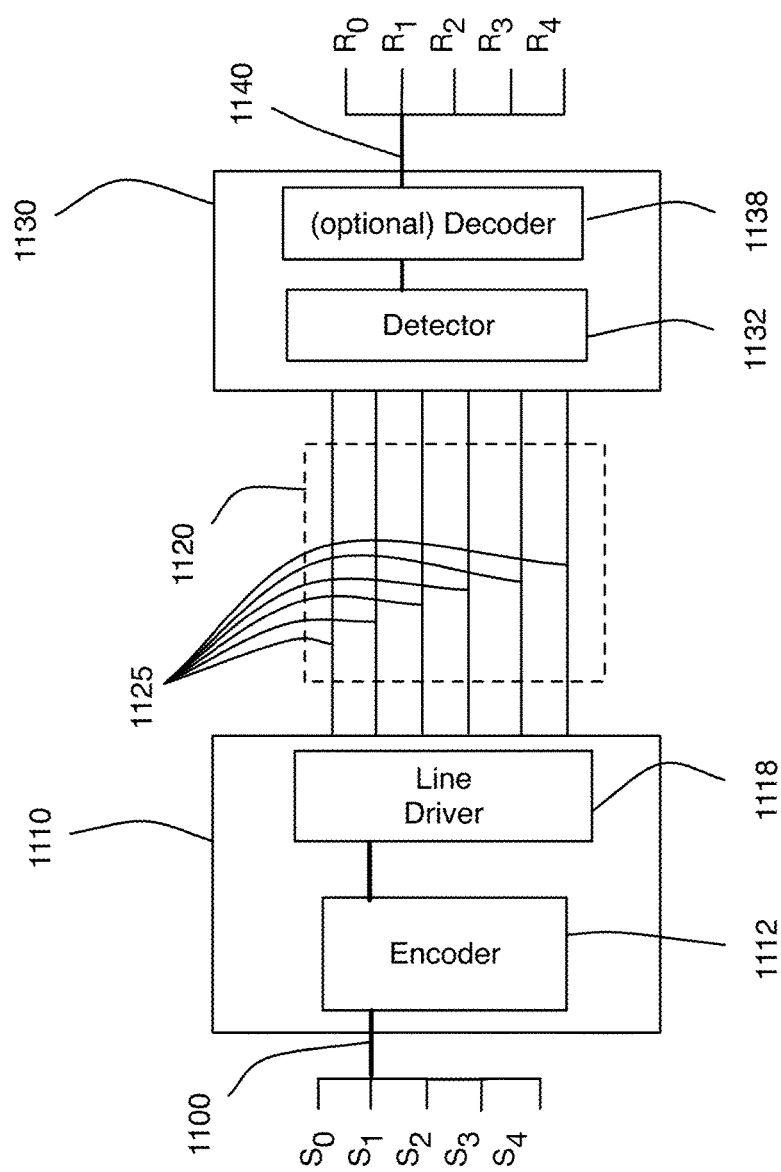
FIG. 11 is a block diagram of a system utilizing the CNRZ-5 code for communication between transmitter 1110 and receiver 1130 via multiple wires 1125.

CNRZ-5 is another vector signaling code designed to communicate five bits over six wires, as described by [Hormati I]. FIG. 11 is a block diagram of a system utilizing the CNRZ-5 code for communication between transmitter 1110 and receiver 1130 via multiple wires. As in FIG. 8, data source $S_0$-$S_4$ and data sink $R_0$-$R_4$ may be host computing devices, or adapters or transceivers supporting another interface type. In some embodiments, transmitters may be co-located with data sources, and receivers may be are co-located with data sinks.

Figure 12:
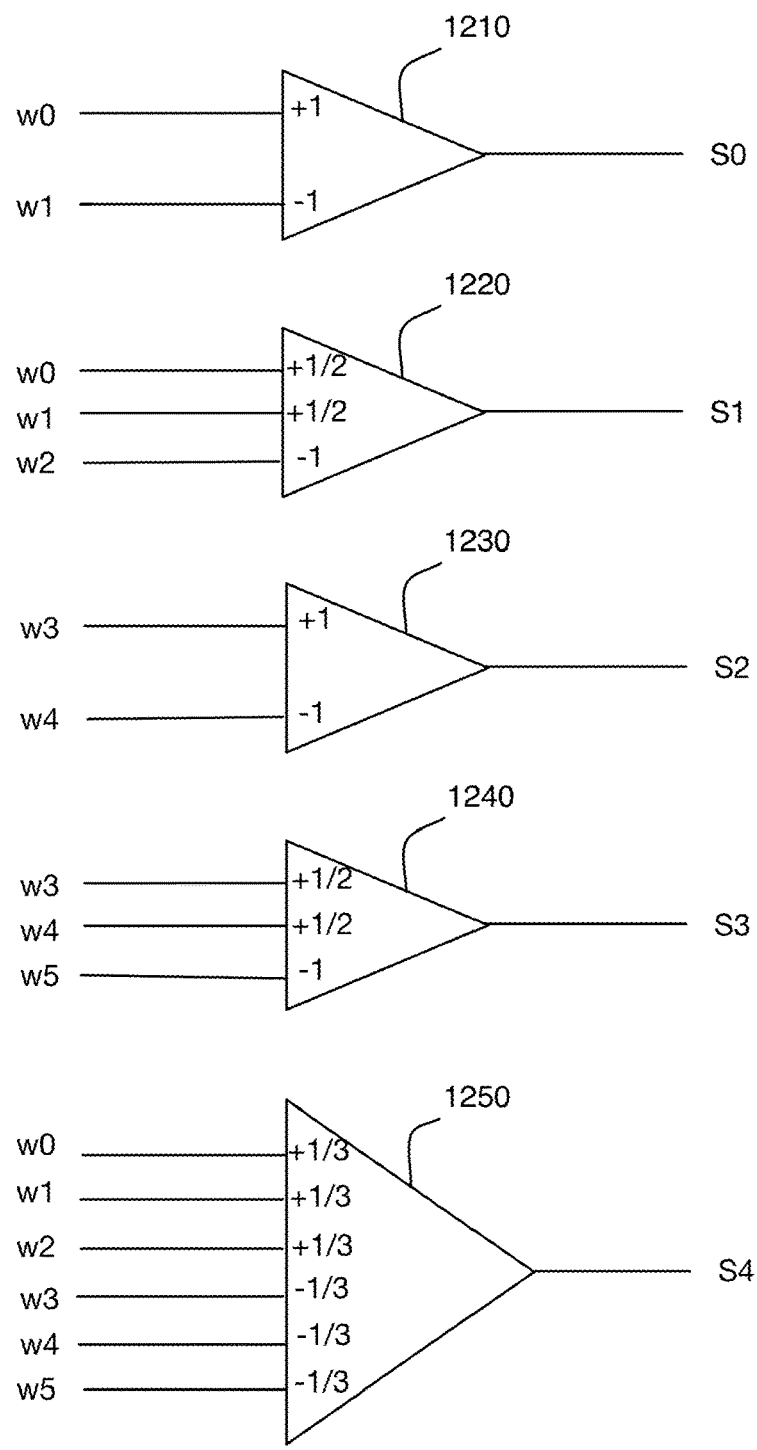
FIG. 12 shows one embodiment of a CNRZ-5 receiver, in which received signals S0-S4 are decoded directly from received wire signals w0-w5 using weighted multi-input comparators.

FIG. 12 shows one embodiment of a CNRZ-5 receiver, in which received signals S0-S4 are decoded directly from received wire signals w0-w5 using weighted multi-input comparators. As described by [Hormati I] five weighted input multi-input comparators fully decode a CNRZ-5 vector signaling code.

Figure 13:
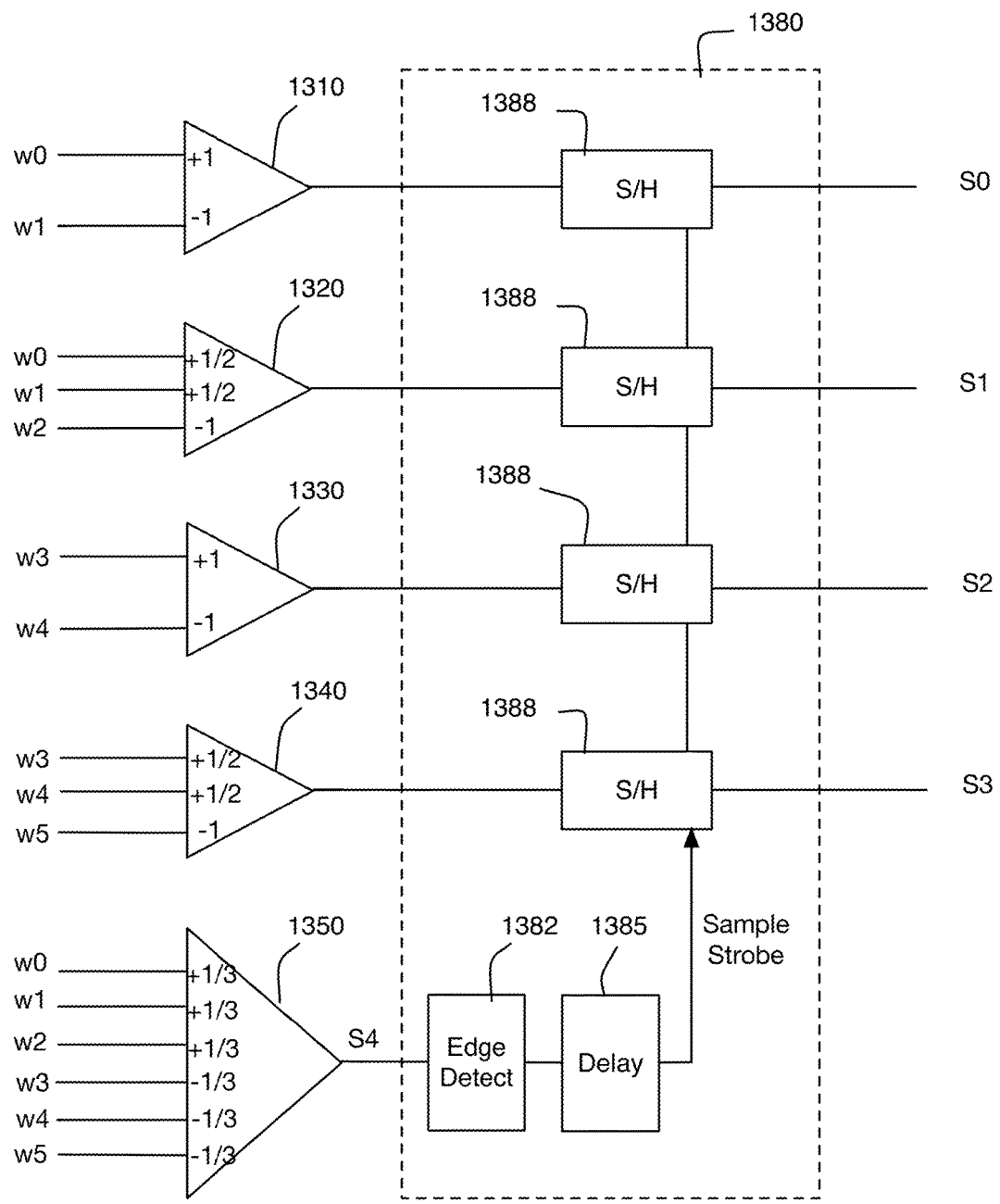
FIG. 13 shows another embodiment of a CNRZ-5 receiver, in which received signals S0-S4 are decoded directly from received wire signals w0-w5 using weighted multi-input comparators, and data signals S0-S3 are then latched by a strobe signal communicated via signal S4.

FIG. 13 shows another embodiment of a CNRZ-5 receiver, in which received signals S0-S4 are decoded directly from received wire signals w0-w5 using weighted multi-input comparators, and data signals S0-S3 are then latched by a strobe signal communicated via signal S4.

Figure 14:
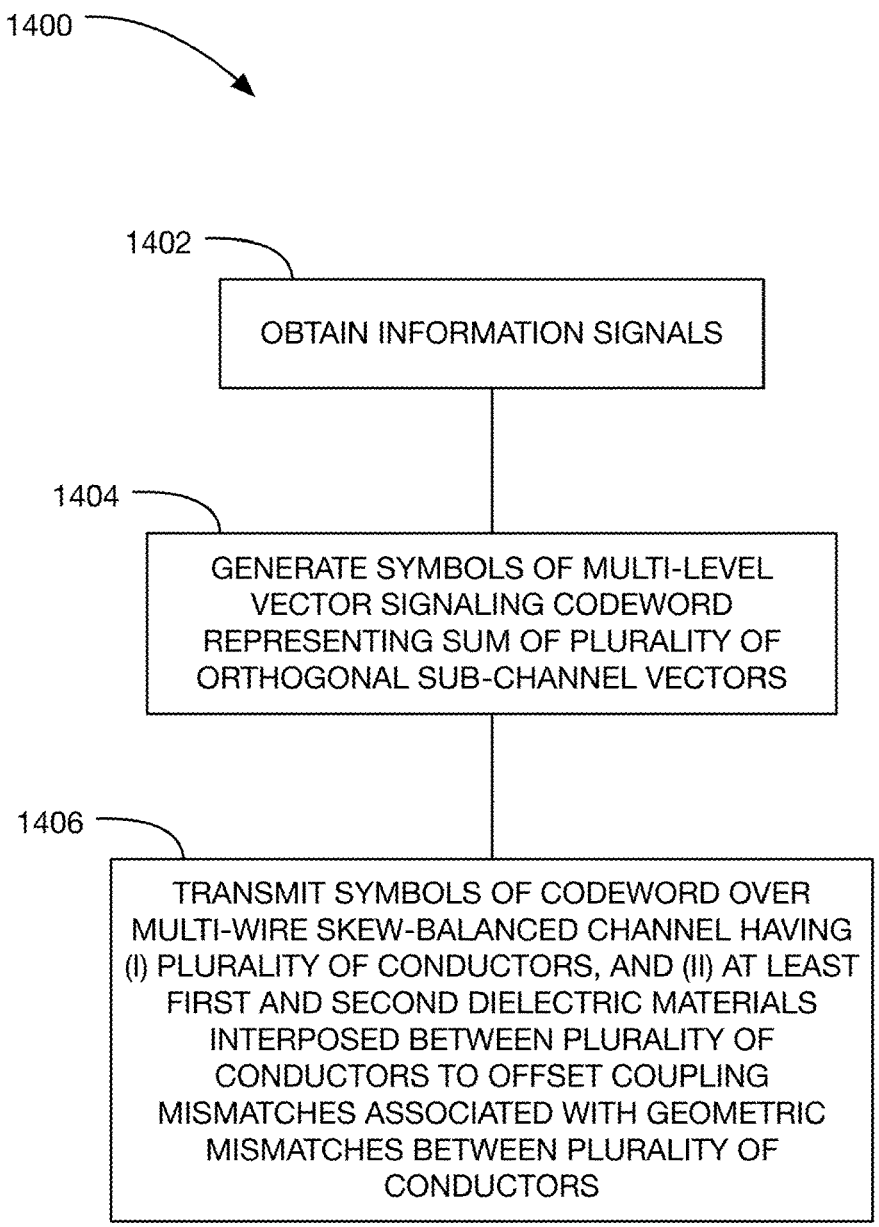
FIG. 14 illustrates a flowchart of a method, in accordance with some embodiments.

FIG. 14 is a flowchart of a method 1400, in accordance with some embodiments. As shown, method 1400 includes obtaining 1402 a set of information signals and responsively generating 1404 symbols of a multi-level vector signaling codeword, the multi-level vector signaling codeword representing a sum of a plurality of orthogonal sub-channel vectors, each sub-channel vector having an associated weight determined by a corresponding information signal. At 1406, the symbols of the codeword are transmitted over a multi-wire skew-balanced channel, the multi-wire skew-balanced channel having (i) a plurality of conductors, each conductor for carrying a respective symbol of the multi-level vector signaling codeword and (ii) at least first and second dielectric materials interposed between the plurality conductors to offset coupling mismatches associated with geometric mismatches between the plurality of conductors.

The examples presented herein illustrate the use of vector signaling codes for point-to-point wire communications. For purposes of explanation, interconnection between a first transmitting device and a second receiving device have been described as unidirectional signaling networks. However, this should not been seen in any way as limiting the scope of the described invention. The methods disclosed in this application are equally applicable to networks capable of alternating signaling direction (i.e. half duplex), or of providing simultaneous communication between separate transmitters and receivers in both directions (i.e. full duplex.) Similarly, more than one instance of the described invention may be used essentially in parallel to communicate wider data words and/or provide higher overall communication bandwidth, with individual instances having individual embedded clocks, or two or more instances sharing a common clock. Other communication media including optical and wireless communications may similarly be used rather than the described wire interconnections. Thus, descriptive terms herein such as "voltage" or "signal level" should be considered to include equivalents in other measurement systems, such as "optical intensity", "RF modulation", etc. As used herein, the term "physical signal" includes any suitable behavior and/or attribute of a physical phenomenon capable of conveying information. Physical signals may be tangible and non-transitory.

We claim:

1. An apparatus comprising:
    a first dielectric material having a plurality of embedded conductors of a multi-wire channel, the plurality of embedded conductors comprising at least a first, second and third conductor, the plurality of embedded conductors for transmitting signals representing symbols of a multi-level vector signaling codeword, wherein a first distance between the first and second conductors is less than a second distance between the first and third conductors, wherein the first dielectric material has a first dielectric constant $\varepsilon_1$; and
    a second dielectric material embedded in the first dielectric material, the second dielectric material embedded in between the first and third conductors, the second dielectric material having a second dielectric constant $\varepsilon_2$, wherein $\varepsilon_2 > \varepsilon_1$.

2. The apparatus of claim 1, wherein at least one of the first and second dielectric materials is one of: a gas, a solid, and a liquid.

3. The apparatus of claim 1, wherein the multi-wire channel has a length l and a width w.

4. The apparatus of claim 3, wherein l $\gg$ w.

5. The apparatus of claim 3, wherein l $\approx$ w.

6. The apparatus of claim 1, wherein the plurality of embedded conductors are pins on a connector.

7. The apparatus of claim 1, wherein the plurality of embedded conductors are wires embedded in the first dielectric material.

8. The apparatus of claim 1, wherein the first dielectric material is embedded in an outer casing.

9. The apparatus of claim 1, further comprising at least a fourth conductor having a third distance between the first and fourth conductors, the third distance greater than the second distance; and
    a third dielectric material embedded in the second dielectric material in between the first and fourth conductor, the third dielectric material has a dielectric constant $\varepsilon_3$, wherein $\varepsilon_3 > \varepsilon_2 > \varepsilon_1$.

10. The apparatus of claim 1, further comprising a transceiver configured to:
    receive a set of information signals;
    generate the signals representing the symbols of the multi-level vector signaling codeword, the multi-level vector signaling codeword representing a sum of a plurality of orthogonal sub-channel vectors, each sub-channel vector having an associated weight determined by a corresponding information signal; and
    provide the signals representing the symbols of the multi-level vector signaling codeword to the plurality of embedded conductors.

11. An apparatus comprising:
    a plurality of conductors of a multi-wire channel configured to transmit a plurality of symbols of a multi-level vector signaling codeword, the plurality of conductors comprising at least a first, a second and a third conductor;
    a first dielectric material housing the plurality of conductors, the first dielectric material having a first dielectric constant $\varepsilon_1$, the first dielectric material disposed in between the first, second, and third conductors, wherein a first distance between the first and second conductors of the plurality of conductors is less than a second distance between the first and third conductors of the plurality of conductors; and
    a second dielectric material embedded in the first dielectric material in between the first and third conductors, the second dielectric material having a second dielectric constant $\varepsilon_2$, wherein $\varepsilon_2 > \varepsilon_1$, the second dielectric material configured to offset a coupling mismatch associated with the first and second distances.

12. The apparatus of claim 11, wherein at least one of the first and second dielectric materials is one of: a gas, a solid, and a liquid.

13. The apparatus of claim 11, wherein the multi-wire channel has a length l and a width w.

14. The apparatus of claim 13, wherein l $\gg$ w.

15. The apparatus of claim 13, wherein l $\approx$ w.

16. The apparatus of claim 11, wherein the plurality of conductors are pins on a connector.

17. The apparatus of claim 11, wherein the second dielectric material equalizes signal propagation speed of signals on the plurality of conductors by offsetting the coupling mismatch, the signals representing the plurality of symbols of the multi-level vector signaling code.

18. The apparatus of claim 11, wherein the first dielectric material is embedded in an outer casing.

19. The apparatus of claim 11, further comprising at least a fourth conductor having a third distance between the first and fourth conductors, the third distance greater than the second distance; and
    a third dielectric material embedded in the second dielectric material in between the first and fourth conductor, the third dielectric material having a dielectric constant $\varepsilon_3$, wherein $\varepsilon_3 > \varepsilon_2 > \varepsilon_1$.

20. The apparatus of claim 11, further comprising a transceiver configured to:
- receive a set of information signals;
- generate signals representing the plurality of symbols of the multi-level vector signaling codeword, the multi-level vector signaling codeword representing a sum of a plurality of orthogonal sub-channel vectors, each sub-channel vector having an associated weight determined by a corresponding information signal; and
- provide the signals representing the symbols of the multi-level vector signaling codeword to the plurality of conductors.

* * * * *